US 9,380,689 B2

(12) United States Patent
Gefter et al.

(10) Patent No.: US 9,380,689 B2
(45) Date of Patent: Jun. 28, 2016

(54) SILICON BASED CHARGE NEUTRALIZATION SYSTEMS

(71) Applicant: Illinois Tool Works Inc., Glenview, IL (US)

(72) Inventors: Peter Gefter, South San Francisco, CA (US); Aleksey Klochkov, San Francisco, CA (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 0 days.

(21) Appl. No.: 14/665,994

(22) Filed: Mar. 23, 2015

(65) Prior Publication Data

US 2015/0282286 A1    Oct. 1, 2015

Related U.S. Application Data

(63) Continuation-in-part of application No. 12/456,526, filed on Jun. 18, 2009.

(60) Provisional application No. 61/132,422, filed on Jun. 18, 2008.

(51) Int. Cl.
*H01T 23/00* (2006.01)
*H05F 3/06* (2006.01)
(Continued)

(52) U.S. Cl.
CPC ............... *H05F 3/06* (2013.01); *B08B 7/0035* (2013.01); *B32B 7/12* (2013.01); *B32B 15/08* (2013.01);
(Continued)

(58) Field of Classification Search
CPC ................... H01T 19/00–19/04; H01T 23/00; H05F 3/06; B08B 7/0035

USPC .................................................. 361/230, 231
See application file for complete search history.

(56) References Cited

U.S. PATENT DOCUMENTS 3,875,035 A    4/1975  Lowther
3,943,407 A    3/1976  Bolasny
(Continued)

FOREIGN PATENT DOCUMENTS

CN    2418879 Y    2/2001
CN    101207964 A    6/2008
(Continued)

OTHER PUBLICATIONS

Notification of Transmittal of the ISR and the Written Opinion (mailed Feb. 19, 2013) for PCT/US2012/064045.
(Continued)

*Primary Examiner* — Stephen W Jackson
*Assistant Examiner* — Christopher Clark
(74) *Attorney, Agent, or Firm* — Uriarte Law

(57) ABSTRACT

An embodiment of the invention provides a method for low emission charge neutralization, comprising: generating a high frequency alternating current (AC) voltage; transmitting the high frequency AC voltage to at least one non-metallic emitter; wherein the at least one non-metallic emitter comprises at least 70% silicon by weight and less than 99.99% silicon by weight; wherein the at least one emitter comprises at least one treated surface section with a destroyed oxidation layer; and generating ions from the at least one non-metallic emitter in response to the high frequency AC voltage. Another embodiment of the invention provides an apparatus for low emission charge neutralization wherein the apparatus can perform the above-described operations.

22 Claims, 16 Drawing Sheets

(51) Int. Cl.

| | | |
|---|---|---|
| *B08B 7/00* | (2006.01) | |
| *B32B 7/12* | (2006.01) | |
| *B32B 15/08* | (2006.01) | |
| *B32B 15/082* | (2006.01) | |
| *B32B 15/085* | (2006.01) | |
| *B32B 15/18* | (2006.01) | |
| *B32B 17/10* | (2006.01) | |
| *B32B 27/30* | (2006.01) | |
| *B32B 27/32* | (2006.01) | |
| *H01L 31/048* | (2014.01) | |

(52) U.S. Cl.
CPC ............ *B32B 15/082* (2013.01); *B32B 15/085* (2013.01); *B32B 15/18* (2013.01); *B32B 17/10009* (2013.01); *B32B 17/10174* (2013.01); *B32B 27/302* (2013.01); *B32B 27/32* (2013.01); *H01L 31/048* (2013.01); *H01T 23/00* (2013.01); *B32B 2255/06* (2013.01); *B32B 2255/20* (2013.01); *B32B 2255/205* (2013.01); *B32B 2270/00* (2013.01); *B32B 2307/202* (2013.01); *B32B 2307/306* (2013.01); *B32B 2307/412* (2013.01); *B32B 2307/554* (2013.01); *B32B 2307/558* (2013.01); *B32B 2307/712* (2013.01); *B32B 2307/7265* (2013.01); *B32B 2307/73* (2013.01); *B32B 2457/12* (2013.01); *Y02E 10/50* (2013.01); *Y10T 428/24942* (2015.01)

(56) References Cited

U.S. PATENT DOCUMENTS

| | | |
|---|---|---|
| 4,138,233 A | 2/1979 | Masuda |
| 4,271,451 A | 6/1981 | Metz |
| 4,417,293 A | 11/1983 | Larigaldie |
| 4,442,356 A | 4/1984 | Ludwick et al. |
| 4,689,715 A | 8/1987 | Halleck |
| 4,781,736 A | 11/1988 | Cheney et al. |
| 4,878,149 A | 10/1989 | Stiehl et al. |
| 4,901,194 A | 2/1990 | Steinman et al. |
| 4,974,115 A | 11/1990 | Breidegam et al. |
| 5,005,101 A | 4/1991 | Gallagher et al. |
| 5,047,892 A | 9/1991 | Sakata et al. |
| 5,055,963 A | 10/1991 | Partridge |
| 5,095,400 A | 3/1992 | Saito |
| 5,116,583 A | 5/1992 | Batchelder et al. |
| 5,153,811 A | 10/1992 | Rodrigo et al. |
| 5,249,094 A | 9/1993 | Hayakawa et al. |
| 5,388,769 A | 2/1995 | Rodrigo et al. |
| 5,447,763 A | 9/1995 | Gehlke |
| 5,535,089 A | 7/1996 | Ford et al. |
| 5,550,703 A | 8/1996 | Beyer et al. |
| 5,630,949 A | 5/1997 | Lakin |
| 5,847,917 A | 12/1998 | Suzuki |
| 6,145,391 A | 11/2000 | Pui et al. |
| 6,252,233 B1 | 6/2001 | Good |
| 6,259,591 B1 | 7/2001 | Pitel et al. |
| 6,330,146 B1 | 12/2001 | Blitshteyn et al. |
| 6,504,700 B1 | 1/2003 | Hahne et al. |
| 6,636,411 B1 | 10/2003 | Noll |
| 6,653,638 B2 | 11/2003 | Fujii |
| 6,671,161 B2 | 12/2003 | Nilsson |
| 6,693,788 B2 | 2/2004 | Partridge |
| 6,807,044 B1 | 10/2004 | Vernitsky et al. |
| 6,826,030 B2 | 11/2004 | Gorczyca et al. |
| 6,850,403 B1 | 2/2005 | Gefter et al. |
| 7,031,133 B2 | 4/2006 | Riebel et al. |
| 7,057,130 B2 | 6/2006 | Gefter et al. |
| 7,126,092 B2 | 10/2006 | Lin et al. |
| 7,177,133 B2 | 2/2007 | Riskin |
| 7,180,722 B2 | 2/2007 | Jacobs et al. |
| D550,340 S | 9/2007 | Sato et al. |
| 7,339,778 B1 | 3/2008 | Gefter et al. |
| 7,375,944 B2 | 5/2008 | Izaki et al. |
| 7,479,615 B2 | 1/2009 | Gefter et al. |
| 7,649,728 B2 | 1/2010 | Fujita et al. |
| 7,679,026 B1 | 3/2010 | Gefter et al. |
| 7,751,695 B2 | 7/2010 | Decker |
| 7,813,102 B2 | 10/2010 | Gefter et al. |
| 7,821,762 B2 | 10/2010 | Yasuoka et al. |
| 7,822,355 B2 | 10/2010 | Schlitz |
| D636,840 S | 4/2011 | Yasuoka et al. |
| D636,841 S | 4/2011 | Yasuoka et al. |
| D639,898 S | 6/2011 | Yasuoka et al. |
| D643,091 S | 8/2011 | Yasuoka et al. |
| 8,009,405 B2 | 8/2011 | Gefter et al. |
| 8,038,775 B2 | 10/2011 | Gefter |
| 8,048,200 B2 | 11/2011 | Gefter et al. |
| 8,063,336 B2 | 11/2011 | Gefter et al. |
| 8,174,814 B2 | 5/2012 | Yasuoka et al. |
| 8,425,658 B2 * | 4/2013 | Lee ............... B01D 53/32 95/76 |
| 8,605,407 B2 * | 12/2013 | Gefter ............... H01T 23/00 361/230 |
| 8,773,837 B2 | 7/2014 | Partridge et al. |
| 8,885,317 B2 | 11/2014 | Partridge |
| 2002/0125423 A1 | 9/2002 | Ebeling et al. |
| 2003/0007307 A1 * | 1/2003 | Lee ............... H01T 19/04 361/232 |
| 2003/0011957 A1 | 1/2003 | Nilsson |
| 2004/0130271 A1 | 7/2004 | Sekoguchi et al. |
| 2005/0052815 A1 | 3/2005 | Fujiwara et al. |
| 2005/0083633 A1 * | 4/2005 | Riebel ............... H01T 23/00 361/227 |
| 2005/0116167 A1 | 6/2005 | Izaki et al. |
| 2005/0225922 A1 | 10/2005 | Gefter et al. |
| 2005/0236375 A1 | 10/2005 | Gefter et al. |
| 2006/0018811 A1 | 1/2006 | Taylor et al. |
| 2006/0021508 A1 | 2/2006 | Kwon et al. |
| 2006/0071599 A1 * | 4/2006 | Curtis ............... H01T 19/04 313/633 |
| 2006/0200921 A1 * | 9/2006 | Shih ............... B08B 1/04 15/21.1 |
| 2006/0232908 A1 | 10/2006 | Izumi et al. |
| 2007/0279829 A1 | 12/2007 | Gefter et al. |
| 2008/0151465 A1 | 6/2008 | Fujita et al. |
| 2008/0199208 A1 | 8/2008 | Schlitz |
| 2008/0225460 A1 | 9/2008 | Gefter et al. |
| 2008/0232021 A1 | 9/2008 | Gefter et al. |
| 2009/0207548 A1 * | 8/2009 | Seto ............... H01T 23/00 361/231 |
| 2009/0316325 A1 | 12/2009 | Gefter |
| 2011/0139889 A1 | 6/2011 | Ohtsuka et al. |
| 2011/0299214 A1 | 12/2011 | Gefter et al. |
| 2012/0200982 A1 | 8/2012 | Partridge |
| 2012/0224293 A1 | 9/2012 | Partridge et al. |

FOREIGN PATENT DOCUMENTS

| | | | | |
|---|---|---|---|---|
| DE | 102004041374 A1 * | 3/2006 | ............ | D01G 15/88 |
| EP | 0 386 317 | 9/1990 | | |
| EP | 0 386 318 A1 | 9/1990 | | |
| EP | 0386318 A1 | 9/1990 | | |
| EP | 0386318 B1 | 7/1994 | | |
| EP | 1142455 | 11/2003 | | |
| EP | 1 547 693 A1 | 6/2005 | | |
| EP | 1 547 693 B1 | 5/2012 | | |
| FR | 2 466 886 | 4/1981 | | |
| JP | 1983 S58-131131 | 8/1983 | | |
| JP | 61-74639 | 4/1988 | | |
| JP | S63-143954 | 6/1988 | | |
| JP | 2005-328904 | 3/1989 | | |
| JP | H03-230499 | 3/1989 | | |
| JP | H03-230499 | 10/1991 | | |
| JP | H0435958 Y2 | 8/1992 | | |
| JP | 5047490 | 2/1993 | | |
| JP | H06-275366 | 9/1994 | | |
| JP | 7249497 | 9/1995 | | |
| JP | 2520311 B2 | 7/1996 | | |
| JP | 10055896 | 2/1998 | | |
| JP | H10-156213 | 6/1998 | | |
| JP | 11273893 | 9/1999 | | |

(56) References Cited

FOREIGN PATENT DOCUMENTS

| | | | |
|---|---|---|---|
| JP | 2000-058290 | 2/2000 | |
| JP | 2000-133413 | 5/2000 | |
| JP | 2001-085189 | 3/2001 | |
| JP | 2002-025748 | 1/2002 | |
| JP | 2002216994 | 9/2002 | |
| JP | 3401702 B2 | 4/2003 | |
| JP | 3536560 B2 | 6/2004 | |
| JP | 2005-216539 | 8/2005 | |
| JP | WO 2005088794 A1 * | 9/2005 | ............. H01T 23/00 |
| JP | 2006-12520 | 1/2006 | |
| JP | 2006-092866 | 4/2006 | |
| JP | 2006-196378 | 7/2006 | |
| JP | 2008-124035 A | 5/2008 | |
| JP | 2009-004162 A | 1/2009 | |
| JP | 200939893 | 9/2009 | |
| JP | 4465232 B2 | 5/2010 | |
| JP | 2010-534382 A | 11/2010 | |
| JP | 5046390 B2 | 10/2012 | |
| JP | I384905 | 2/2013 | |
| TW | 200939893 | 9/2009 | |
| WO | WO 00/38484 | 6/2000 | |
| WO | WO 2005/102582 | 11/2000 | |
| WO | WO 03/049509 | 6/2003 | |
| WO | WO 03100932 | 12/2003 | |
| WO | WO 2008/115465 | 9/2008 | |
| WO | WO 2008/115884 | 9/2008 | |
| WO | WO 2013/103368 A1 | 7/2013 | |

OTHER PUBLICATIONS

International Search Report and Written Opinion of the ISR (Feb. 19, 2013) for PCT/US2012/064045.
Notification of Transmittal of International Search Report and Written Opinion of the ISA, and International Search Report for PCT/US2008/03488 (Jun. 9, 2009).
International Preliminary Report on Patentability and Written Opinion of the ISA for PCT/US2008/03488 (Jun. 9, 2009).
Written Opinion of the ISA for PCT/US2008/03488 (Jun. 9, 2009).
International Preliminary Report on Patentability and Written Opinion of the ISA for PCT/US2012/024095 (Jul. 5, 2012).
International Search Report for PCT/US2012/024095 (Aug. 16, 2012).
Written Opinion of the ISA for PCT/US2012/024095 (Aug. 13, 2013).
Written Opinion of the ISA (Sep. 17, 2009), and International Search Report (mailed Sep. 25, 2008) for PCT/US2008/057262.
Office Action mailed on Aug. 2, 2012 for U.S. Appl. No. 13/210,267.
Office Action mailed Nov. 21, 2012 for U.S. Appl. No. 13/210,267.
Office Action mailed Aug. 3, 2010 for U.S. Appl. No. 12/049,350.
Office Action mailed Jan. 4, 2011 for U.S. Appl. No. 12/049,350.
International Preliminary Report on Patentability and Written Opinion for PCT/US05/09093, Jul. 28, 2005.
International Search Report for PCT/US05/09093, Jul. 28, 2005.
Office Action (Advisory Action) mailed Apr. 11, 2013 for U.S. Appl. No. 13/210,267.
Office Action mailed Jan. 4, 2011 for U.S. Appl. No. 13/023,397.
PCT Application PCT/US2012/033278, Notification of Trans . . . , International Search Report and Written Opinion of the International Searching Authority, mailed Sep. 14, 2012.
PCT/US08/03488 International Search Report; ISA/US; Jun. 9, 2009.
Webpages from LIROS website, pages, date unknown, available online at http ://www.liroselectronic.com and http://www.liroselectronic.com/documents/NoStatic-2009_eng.pdf.
Office Action mailed Dec. 7, 2011 for U.S. Appl. No. 12/456,526.
Office Action mailed Jul. 5, 2012 for U.S. Appl. No. 12/456,526.
Applicant-initiated Interview summary mailed Oct. 5, 2012 for U.S. Appl. No. 12/456,526.
Advisory Action mailed Oct. 5, 2012 for U.S. Appl. No. 12/456,526.
Notice of allowability mailed Dec. 16, 2013 for U.S. Appl. No. 13/367,369.
Office Action mailed Jun. 12, 2013 for U.S. Appl. No. 13/367,369.
Office Action mailed Feb. 2, 2013 for U.S. Appl. No. 13/367,369.
Notice of Allowability mailed Dec. 1, 2005 for U.S. Appl. No. 10/821,773.
Office Action mailed Aug. 11, 2005 for U.S. Appl. No. 10/821,773.
Office Action mailed Mar. 10, 2005 for U.S. Appl. No. 10/821,773.
Notice of Allowability mailed Sep. 22, 2008 for U.S. Appl. No. 11/136,754.
Office Action mailed Apr. 30, 2008 for U.S. Appl. No. 11/136,754.
Office Action mailed Jun. 1, 2007 for U.S. Appl. No. 11/136,754.
Office Action mailed Mar. 28, 2007 for U.S. Appl. No. 11/136,754.
Notice of Allowability mailed Jul. 12, 2011 for U.S. Appl. No. 11/398,446.
Interview Summary mailed Mar. 9, 2011 for U.S. Appl. No. 11/398,446.
Office Action mailed Dec. 13, 2010 for U.S. Appl. No. 11/398,446.
Office Action mailed Jun. 10, 2010 for U.S. Appl. No. 11/398,446.
International search report, international preliminary report on patentability, and written opinion mailed Jul. 23, 2008 for PCT application PCT/US2007/065767.
Office Action mailed Jan. 28, 2010 for U.S. Appl. No. 11/398,446.
Notice Allowance mailed Oct. 28, 2009 for U.S. Appl. No. 11/623,316.
Office Action mailed Jul. 22, 2009 for U.S. Appl. No. 11/623,316.
Office Action mailed Oct. 30, 2008 for U.S. Appl. No. 11/623,316.
Search Report for Taiwan Invention Patent Application No. 101103565, dated Dec. 16, 2013.
Office Action mailed Mar. 11, 2014 for U.S. Appl. No. 12/456,526.
Notification of transmittal of the Int'l Search Report and the written opinion of the ISA, & ISR & Written Opinion of ISA (mailed May 7, 2012) for PCT/US2012/024095.
Notice of Allowance for U.S. Appl. No. 13/367,369, mailed on May 9, 2014.
Notice of Allowance for U.S. Appl. No. 12/075,967, mailed on Aug. 16, 2010.
Notice of Allowance for U.S. Appl. No. 12/075,967, mailed on Jun. 3, 2010.
Notice of Allowance for U.S. Appl. No. 12/075,967, mailed on Mar. 9, 2010.
Notice of Allowance for U.S. Appl. No. 13/023,397, mailed on Mar. 17, 2014.
Office Action for U.S. Appl. No. 13/023,397, mailed on Jul. 19, 2013.
Notification of transmittal of ISR and Written Opinion, Written Opinion and ISR dated Jan. 6, 2015 for PCT/US2015/010246.
Notice of Allowance for U.S. Appl. No. 13/023,397, mailed on Jul. 18, 2014.
Office Action dated Aug. 26, 2015 for U.S. Appl. No. 29/443,821.
Office Action dated Oct. 10, 2014 for U.S. Appl. No. 14/220,130.
Notice of Allowance dated Jul. 16, 2015 for U.S. Appl. No. 29/443,821.
Notice of Allowance dated Jul. 13, 2015 for U.S. Appl. No. 14/220,130.
Office Action dated Jan. 29, 2015 for U.S. Appl. No. 14/220,130.
Notice of Allowance dated Apr. 1, 2015 for U.S. Appl. No. 14/220,130.
Office Action dated Mar. 2, 2015 for U.S. Appl. No. 29/443,821.
Notification of transmittal of the ISR and the written opinion of the ISA, or the declaration, accompanying ISR and written opinion of ISA, mailed Apr. 10, 2015 PCT/US2015/010246.
Office Action dated Nov. 10, 2015 for Japanese Patent Application No. 2013-553488.
Office Action dated Nov. 5, 2015 for Japanese Patent Application No. 2014-012199.
International Search Report for PCT/US2008/003488 date Jun. 9, 2009.

* cited by examiner

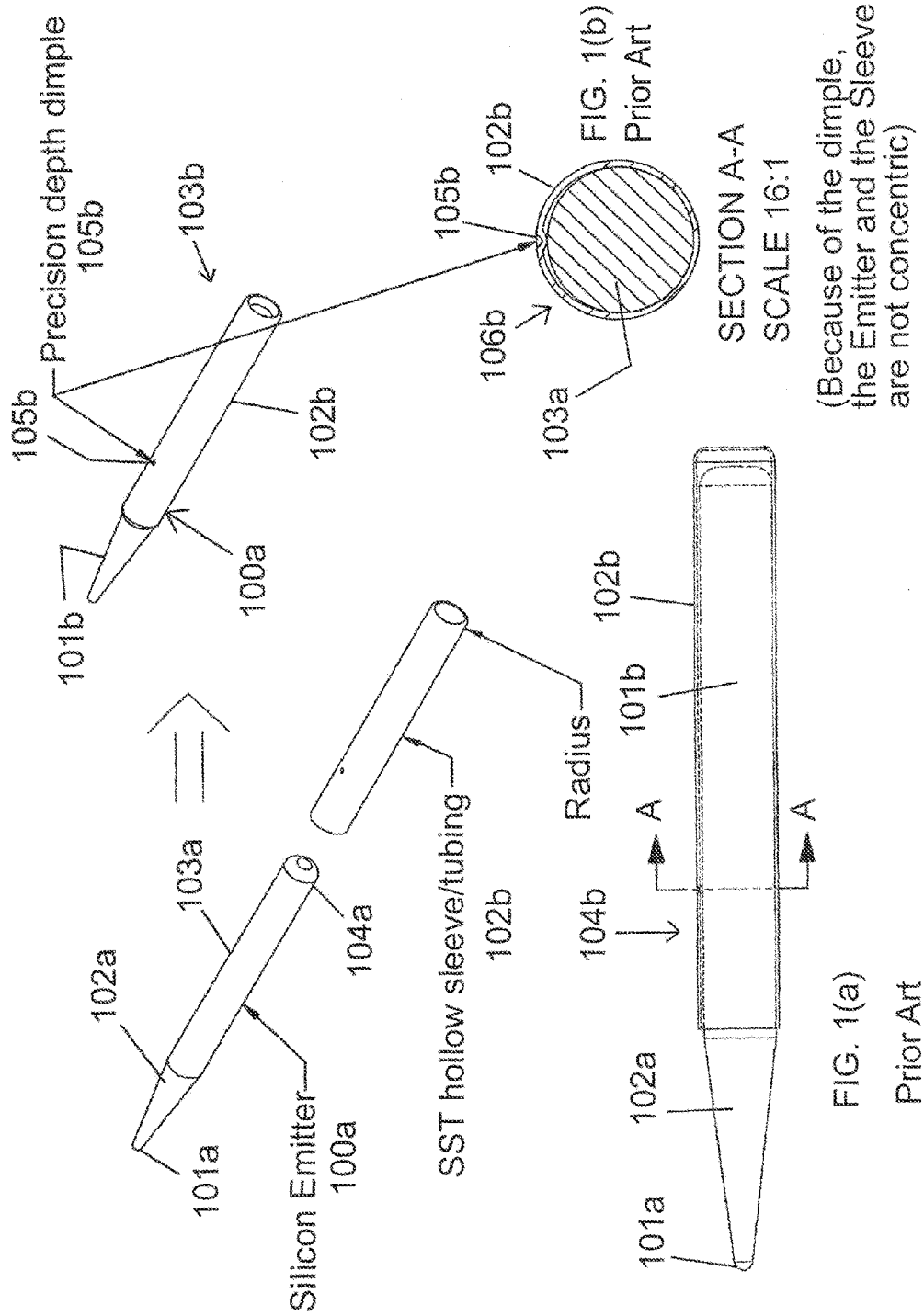

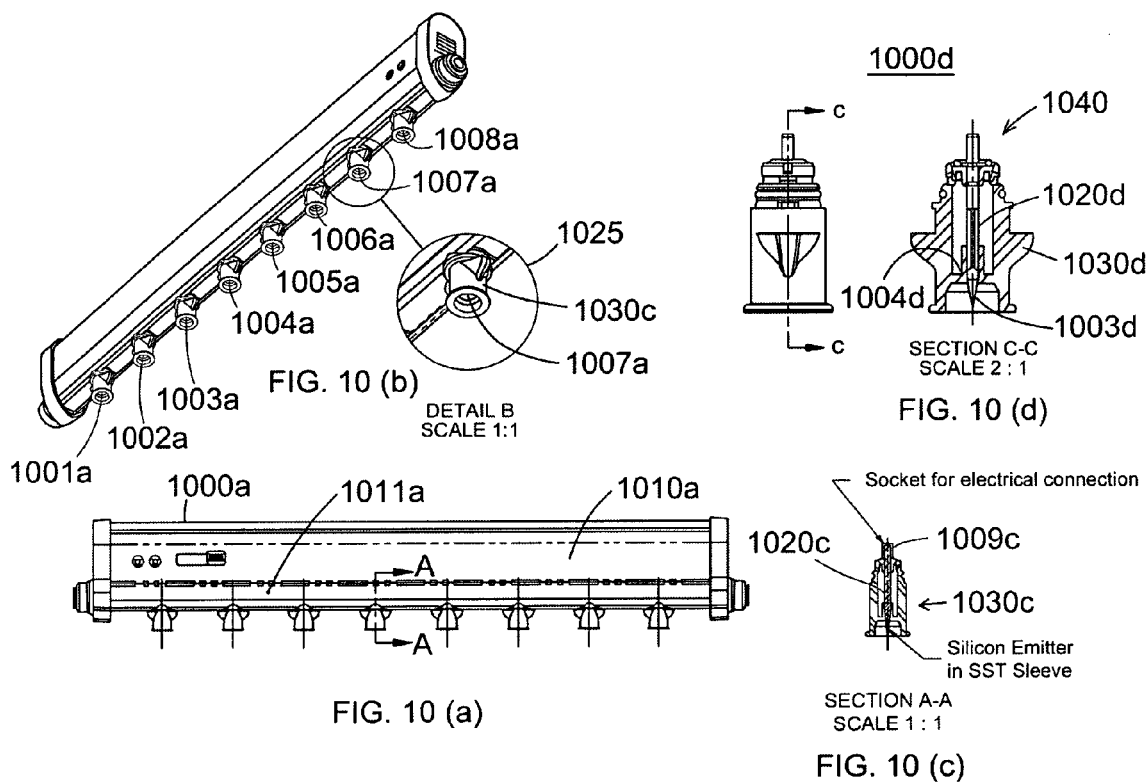

SILICON BASED CHARGE NEUTRALIZATION SYSTEMS

CROSS-REFERENCE TO RELATED APPLICATIONS

This application is a Continuation-In-Part of and claims priority to U.S. application Ser. No. 12/456,526, filed 18 Jun. 2009, entitled "SILICON EMITTERS FOR IONIZERS WITH HIGH FREQUENCY WAVEFORMS" which claims the benefit of and priority to U.S. Provisional Application No. 61/132,422, filed 18 Jun. 2008. U.S. application Ser. Nos. 12/456,526 and 61/132,422 are both hereby incorporated herein by reference.

STATEMENT REGARDING FEDERALLY SPONSORED RESEARCH

Not Applicable

REFERENCE TO A MICROFICHE APPENDIX

Not Applicable

BACKGROUND OF THE INVENTION

1. Field of the Invention

Embodiments of the invention primarily relate to ionizing devices that are used for static charge neutralization and control. More specifically, embodiments of the invention are targeted at the need for reliable and low particle emission ionizers within the semiconductor, electronics, and/or flat panel industries.

With AC ionizers, each emitter receives a high positive voltage during one time period and a high negative voltage during another time period. Hence, each emitter generates corona discharge with output of both positive and negative ions.

A stream (cloud) of positive and negative ions is directed toward a charged target(s) for the purpose of neutralizing the charges and preventing static charge associated technological problems.

2. Description of Related Art

The background description provided herein is for the purpose of generally presenting the context of the present disclosure. Work of the presently named inventors, to the extent the work is described in this background section, as well as aspects of the description that may not otherwise qualify as prior art at the time of filing, are neither expressly nor impliedly admitted as prior art against this present disclosure.

Ion emitters of charge neutralizers generate and supply both positive ions and negative ions into the surrounding air or gas media. To generate gas ions, the amplitude of the applied voltage must be high enough to produce a corona discharge between at least two electrodes arranged as an ionization cell. In the ionization cell, at least one electrode is an ion emitter and another one may be a reference electrode. Also it is possible that the ionization cell includes at least two ionizing electrodes.

Along with useful positive gas ions and negative gas ions, emitters of charge neutralizers may create and emit corona byproducts including unwanted particles. In a semiconductor process and similar clean processes, particle emission/contamination correlate with defects, product reliability problems, and lost of profits.

Several known in the art factors influence the quantity of unwanted particles emission. Some of primer factors include, for example, the material composition, geometry, and design of the ion emitter. The second one includes the arrangement of the emitter connection to a high voltage power supply. Another critical factor is associated with a profile of electrical power (magnitude and time dependence of high voltage and current) that is applied to the ion emitters.

The power waveforms can be used to control the voltage profile that is applied to the emitters by the high voltage power supplies. Voltage/current waveforms can be used to control both ion generation and particle emission by emitter(s).

Corona discharge can be energized by DC (direct current) voltage, AC (alternating current) voltage, or a combination of both voltages. For many applications of this invention, a preferable power waveform is a high frequency high voltage (HF-HV) output from a high frequency (HF) power supply, as will be discussed below. This high voltage output may be continual rather than continuous. That is, the voltage output may be variable by amplitude in time or turned off periodically.

The material composition of emitters is known to affect particle emission levels of ionizers. Common emitter materials include stainless steel, tungsten, titanium, silicon oxide, single crystal silicon, silicon carbide, and other nickel or gold plated metals. This list is not complete. From the experience of the inventors, metallic type emitters are prone to generate more particles as a result of corona associated erosion and spattering. Moreover, metallic or, in general, highly conductive particles are often considered as "killer particles" in the semiconductor industry (i.e., the particles are able to short-circuit tightly positioned conductive traces of wafers/chips). So, in the frame of this patent application the inventors basically consider non-metallic ion emitters, as will be discussed below.

In one of these materials, a super clean (more than 99.99% plus purity) single crystal silicon is suggested by Scott Gehlke in U.S. Pat. No. 5,447,763 from the viewpoint of low particle emission. This single crystal silicon has been adopted by the semiconductor industry as a de-facto clean emitter standard. A super clean silicon carbide (at least 99.99% pure) suggested by Curtis et al. in U.S. patent application publication No. 2006/0071599 is another non-metallic material. However, silicon carbide emitters are expensive and prone for emission of undesirable particles.

Known ionizers with single crystal silicon emitters are powered by two high voltage DC supplies. A system, like the room ionization system "NiLstat" 5000 (Ion Systems, Inc.) for cleanroom ceiling installation, typically produces less than 60 particles per cubic foot of air that are greater than 10 nanometer (diameter). Other emitter materials typically produce more than 200 particles per cubic foot of air that are greater than 10 nanometer (diameter). Some materials produce thousands of particles per cubic foot of air that are greater than 10 nanometer (diameter).

Although some of (1) components of emitter materials, (2) elements of connector construction for a non-metallic emitter, and (3) application of special power waveforms may be known to be independently important, the prior art has not considered the benefits of strategically combining these factors to reach high ionization reliability and cleanliness.

Recent experiments by the inventors have resulted in the inventors discovering and finding novel combinations that lead to stable ion production and unpredictably low levels of particle generation by the emitter. Clean and/or low particle emission ionizers have utility in several high technology industries. In particular, the semiconductor industry has a well-defined need for super clean ionizers. The ionizers are needed to minimize static charges and electrical fields, which can destroy semiconductor devices. As low as possible particle emission is also required because foreign particles may compromise the reliability of semiconductor devices. Leading edge semiconductor technology is building 24-16 nanometer features on wafers. For the nanometer features, control of particles greater than 10 nanometers is absolutely needed.

It is to be understood that both the foregoing general description in the background section are exemplary and explanatory only and are not restrictive of the invention, as claimed.

BRIEF SUMMARY OF THE INVENTION

Recent experiments by the inventors have shown that (1) the composition of silicon based material and emitter design, (2) the arrangement and/or construction of the emitter connector, and (3) the type of power voltage waveforms should be considered as a complex novel beneficial combination for reliable performance of and low particle emission by the emitter. Found combinations by the inventors lead to stable ion production and unpredictably low levels of particle generation by the emitter. Clean and/or low particle emission ionizers have utility in several high technology industries. In particular, the semiconductor industry has a well-defined need for super clean ionizers. The ionizers are needed to minimize static charges and electrical fields, which can destroy semiconductor devices. As low as possible particle emission is also required because foreign particles may compromise the reliability of semiconductor devices. Leading edge semiconductor technology is building 24-16 nanometer features on wafers. For the nanometer features, control of particles greater than 10 nanometers is absolutely needed.

Matching of the emitter electrode composition comprising silicon based material, electrode connector, and power waveform that is applied to the emitter have proven to be a novel method of achieving previously unattainable levels reliability and cleanliness of a charge neutralizing ionizer. The core of exemplary embodiments of this invention is the combination of the following: non-metallic ion emitter having material/chemical composition in the range between less than 99.99% to at least 70% silicon by weight, emitter electrode design and surface treatment (preparation), connection arrangement for the emitter, and operating in a high frequency range high voltage power supply. In this combination the high frequency high voltage power generates mode of corona discharge featured by low onset voltages. The ions generated from at least one non-metallic emitter in an embodiment of the invention comprises positive ions and negative ions that are generated at minimum onset HF voltage and power.

This combination is effective and applicable for many different types of clean room ionizers/charge neutralizers. As an example, an ionizer in an embodiment of the invention can be considered an in-line ionizer targeted for a class 1 cleanroom production environment. This ionizer may have an incoming flow of clean dry air (CDA) or nitrogen, argon, or other noble gas. The gas or air passes along the silicon based emitter inside an ionizing cell. The ionizing cell/chamber is typically enclosed except for the air/gas inlet and outlet openings.

The design of an in-line charge neutralizing ionizer according to embodiments of the invention can be using a compact power source like high frequency high voltage supply. An output connector of the power supply accommodates at least one silicon based emitter. An ionization cell produces clean bipolar ionization. The air stream (or nitrogen or argon stream or other gas stream) suffices to move the ions from the ionizing emitter (cell or chamber) to a target of charge neutralization.

The high frequency voltage profile of the power supply has an AC frequency range of approximately 1 KHz to 100 kHz. Peak voltages exceed the corona onset voltages (positive and negative) of the emitters. An ion current of the emitter at high frequency AC is substantially limited by the electrical resistance of the silicon based material.

Within this instant application, high voltages are defined as the difference in potentials between at least one ion generating electrode and the reference electrode. In some high frequency AC ionizing cells the reference electrode can be isolated from the ionizing electrode by dielectric wall. Therefore, possibilities of direct electrons, ions avalanches (like spark discharge) between electrodes are practically excluded and particle emission from the emitter is greatly diminished. During operation mode ions are generated whenever the voltage amplitude exceeds the corona positive and negative onset voltages applied to the ionizing electrode.

Another frequency (optional) becomes pertinent when the high frequency AC voltage profile is periodic rather than continuous. That is, the high frequency AC voltage exceeding the onset voltage profile is generated only within predefined time intervals. In this scenario, the high frequency AC voltage is applied to the emitters during active time intervals (typically approximately 0.01 second or less to approximately 1 or more seconds), but a lower than onset voltage can be applied during inactive time intervals. This optional high frequency voltage waveform may also include essentially an on/off high voltage mode. A normal low voltage or on/off frequency range is approximately 0.1 Hertz to 500 Hertz, but the frequency may lie outside this range.

Some silicon-containing emitter compositions are provided as examples. They are: (a) doped crystal silicon, (b) doped poly silicon, (c) combination doped silicon and silicon oxide, and (d) deposited on substrate doped silicon. Dopants and additives are mainly targeted to control surface and volume electrical resistivity, as well as the mechanical property of silicon based emitters. They preferably are taken from known non-metallic dopant groups like boron, arsenic, carbon, phosphorous, and others.

Accordingly, at least one exemplary embodiment of the invention provides a method for low emission charge neutralization, comprising: generating a high frequency alternating current (AC) voltage; transmitting the high frequency AC voltage to at least one non-metallic emitter; wherein the at least one emitter comprises at least 70% silicon by weight and less than 99.99% silicon by weight; wherein the at least one non-metallic emitter comprises at least one treated surface section with a destroyed oxidation layer; and generating ions from the at least one non-metallic emitter in response to the high frequency AC voltage.

At least one exemplary embodiment of the invention also provides an apparatus comprising elements that permit the above-described functionalities. For example, an embodiment of the invention provides an apparatus for low emission charge neutralization, comprising: at least one non-metallic emitter comprising at least 70% silicon by weight and less than 99.99% silicon by weight; wherein the at least one non-metallic emitter comprises at least one treated surface section with a destroyed silicon oxide layer; and wherein the at least one non-metallic emitter generates ions in response to the high frequency AC voltage.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) of the invention and together with the description, serve to explain the principles of the invention.

BRIEF SUMMARY OF THE FIGURES

Non-limiting and non-exhaustive embodiments of the invention are described with reference to the following figures, wherein like reference numerals refer to like parts throughout the various views unless otherwise specified.

It is to be noted, however, that the appended drawings illustrate only typical embodiments of this invention and are therefore not to be considered limiting of its scope, for the invention may admit to other equally effective embodiments.

FIG. 1(a) is an illustration of a conventional single crystal silicon ion emitter, or (in general) a non-metallic ion emitter.

FIGS. 1(b) and 1(c) show illustrations of conventional parts and an assembly of a single crystal silicon emitter with metal sleeves and grooves.

FIGS. 10(a), 10(b), 10(c), and 10(d) show illustrations of a simplified structure of a high frequency AC ionizing bar, and details of nozzles with silicon based ion emitters, in accordance with an embodiment of the invention.

DETAILED DESCRIPTION

Figure 1C:
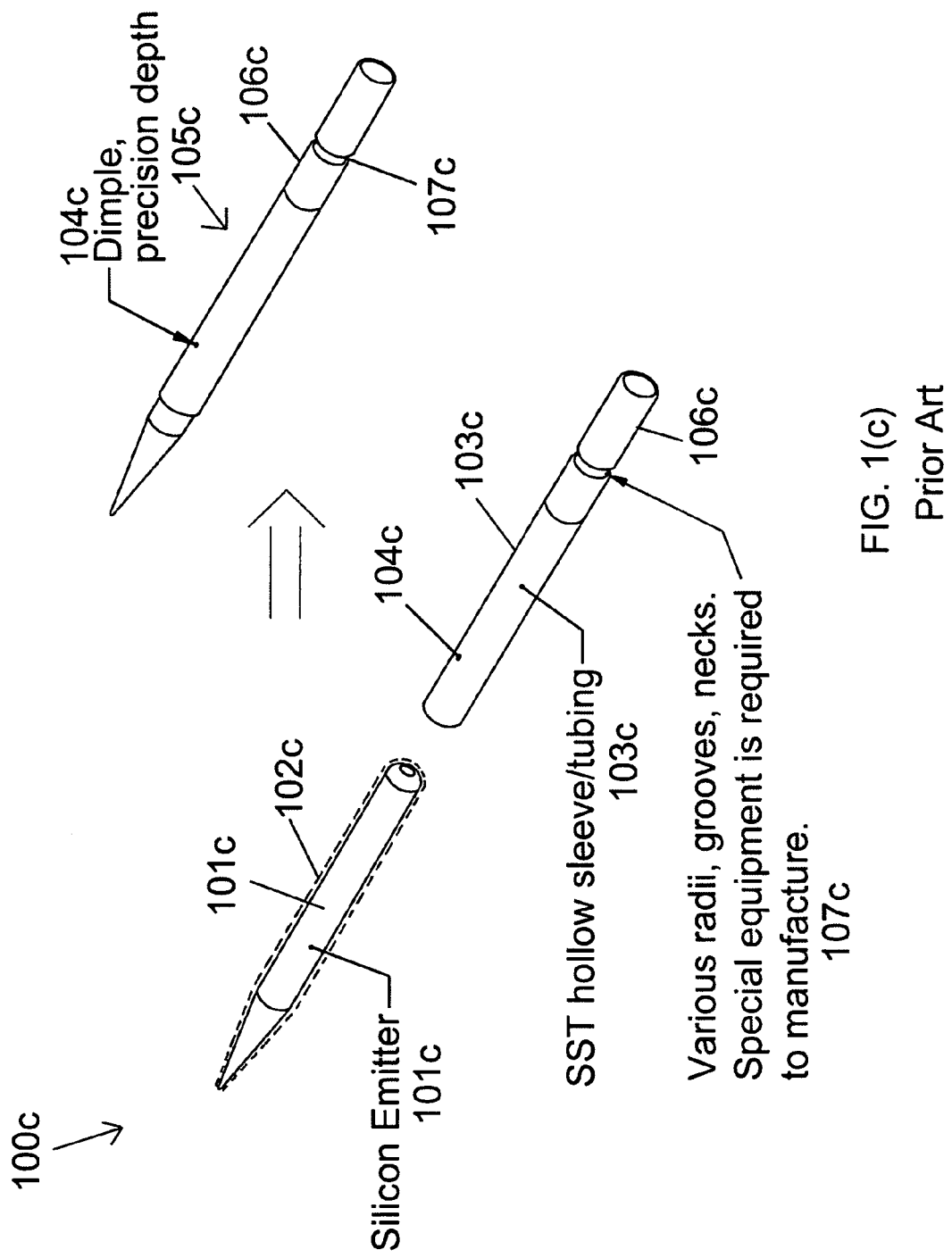

In the following detailed description, for purposes of explanation, numerous specific details are set forth to provide a thorough understanding of the various embodiments of the present invention. Those of ordinary skill in the art will realize that these various embodiments of the present invention are illustrative only and are not intended to be limiting in any way. Other embodiments of the present invention will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual implementation, numerous implementation-specific decisions may be required to achieve specific design objectives. These design objectives will vary from one implementation to another and from one developer to another. Moreover, it will be appreciated that such a development effort might be complex and time-consuming, but would nevertheless be a routine engineering undertaking for those of ordinary skill in the art having the benefit of this disclosure. The various embodiments disclosed herein are not intended to limit the scope and spirit of the herein disclosure.

Exemplary embodiments for carrying out the principles of the present invention are described herein with reference to the drawings. However, the present invention is not limited to the specifically described and illustrated embodiments. A person skilled in the art will appreciate that many other embodiments are possible without deviating from the basic concept of the invention. Therefore, the principles of the present invention extend to any work that falls within the scope of the appended claims.

As used herein, the terms "a" and "an" herein do not denote a limitation of quantity, but rather denote the presence of at least one of the referenced items.

Experimentally, it has been shown by the inventors that, for example, an in-line ionizer combining (1) silicon-containing emitter (2) configured as a pin type electrode in contact with a conductive socket and capacitive receiving (3) a high frequency AC voltage waveform reliably produces an electrically balanced ion gas stream with very few particles. The above-noted combination creates ionization with reliability and cleanliness levels that cannot be reached separately by either known in the art non-metallic silicon-containing emitters or the high frequency AC voltage waveform. Cumulative particles greater than or equal to 10 nm in diameter were measured during cleanliness testing. The particle counters (like CNC—condense particle counter) did not separate particles into size ranges.

For example, two single crystal silicon emitters for a clean room ionization system (e.g., NiLstat ionization system) (similar to the system 200 shown in FIG. 2) connected to a DC or pulsed DC (+/−20 kV) power source (discussed in U.S. Pat. No. 5,447,763) generate roughly 60 particles (greater than 10 nanometers in diameter) per cubic foot of air. In contrast, an ionizer disclosed by an embodiment of the invention typically yields less than 10 same-diameters of nano-particles per cubic foot of air. In perspective, 10 particles per cubic foot of air greater than 10 nanometers is nominally 6 times cleaner than the cleanest prior art ionizers at the time of this application.

In a contrasting example, a metallic emitter (tungsten) was tested with a conventional system (e.g., the system in U.S. Pat. No. 5,447,763) and showed an unacceptable in clean room amount of particle emission. Our experiment to use a tungsten emitter in combination with a high frequency AC high voltage waveform similar to that suggested in U.S. patent application publication No. 2003/0007307 (to Lee et al.) had little benefit in cleanliness compared to that conventional system that was previously disclosed in U.S. Pat. No. 5,447,763. The particle concentration count results in both cases of testing tungsten emitters were above 600 particles (greater than 10 nanometers) per cubic foot of air.

However, a high purity (99.99% plus purity) single crystal silicon emitter (like the emitter shown in FIGS. 1(a), 1(b), and 1(c)) has high electrical resistance (in the mega Ohms range). When this emitter(s) is connected to a high frequency (HF) AC voltage power source often ion production is not enough for efficient charge neutralization. The main reason is because most of the HF (high frequency) electrical current/voltage goes to a stray capacitor but not to the emitter tip.

Another problem associated with a high purity (99.99% plus purity) single crystal silicon emitter is that the emitter is prone to create a surface oxide "skin" (oxide layer or skin shown by dashed line 102c that surrounds the surface of the silicon emitter 101c in FIG. 1(c)). This skin/layer 102c is composed of a highly isolative silicon oxide ($SiO_2$). Silicon oxide growth on the surface of a clean silicon wafer is discussed, for example, in the following publication by Stanford University, California, "Growth of native oxide" Stanford University Nanofabrication Facility, 28 Aug. 2003.

An end result of the silicon oxide layer growth phenomenon is that a non-metallic silicon emitter/pin is surrounded by this isolative layer and does not have good, reliable connection with an electrical socket and hence to a high voltage output of an HF power supply.

Another non-metallic ion emitter is discussed in U.S. patent application publication No. US 2006/0071599 to Curtis et al. This emitter is made from high purity 99.99% silicon carbide. This material is a composite with about 30% carbon. It is known in the art that silicon carbide has high hardness. Silicon carbide is also expensive in machining to produce as a pin type emitter configuration. Also, silicon carbide has a metallic type high electrical conductance. Conductive particles from a composite with high carbon content are often undesirable in the semiconductor industry.

Wide acceptance of silicon material in the semiconductor industry dictates relatively low cost of the ion emitter material. Moreover, mechanical properties of silicon-based material made machining simple (cutting, polishing, and so on). A small concentration of silicon dopants and additives are mainly targeted to control the surface and volume electrical resistivity, as well as to improve mechanical property of silicon based emitters. They preferably can be taken from known non-metallic dopant groups like boron, arsenic, carbon, phosphorous, and others.

Silicon based composition with silicon content which is less than 99.99% and more than 70% by weight made possible to reach electrical resistance of emitters in the kilo-ohms range, in an embodiment of the invention. This resistance is low enough to conduct high frequency current and to support stable corona discharge. So, the two following certain factors consistently interact to create the observed cleanliness improvement: the composition and design of silicon based emitter and the high frequency AC emitter driving power/voltage waveform.

One of the advantages of the combination of silicon based emitters and HF voltage waveform is that the onset voltage of corona discharge is significantly lower (approximately 1,000 V to 3,000 V or more) than for DC, pulse DC, or low frequency (50 Hz to 60 Hz) voltages for non metallic emitters.

A possible explanation of this effect is that at high frequency in the range (approximately 1 kHz to 100 kHz or more), the voltage applied to the emitter changes polarity in the milliseconds range or micro seconds range. That is why corona charge carriers (positive and negative ions, electrons) do not have enough time to move far away from the emitter tip. Also, specific surface charge conservation (often named as "charge memory") properties of silicon based material may play a role in electrode surface electron emission. That is why both positive and negative high frequency corona onset voltages are low. With lower voltage of HF corona discharge, the particle emission from the silicon based emitter is also low.

The scientific basis for the particle emission improvement in corona discharge of balanced ionizers due to the interaction between non-metallic silicon based emitter and the high frequency AC voltage waveform is currently being studied. Recognized theories of corona discharge and/or of ionization and/or of particle emission from non-metallic emitters do not predict or completely explain the experimental cleanliness observed.

However, how to make and use the instant invention is clearly understood. The following written description is directed toward explaining how to make and use this invention to one of ordinary skill in the static charge control field.

Experimental works directed to embodiments of the invention comprising a combination of silicon based emitter's composition and HF voltage waveform showed that, in some instances, ionizers with brand new or long time idle emitters show a problem to start HF corona discharge and reliably produce ion generation. Measurements show high contact resistance between the silicon emitters and electrical sockets. This high resistance is one of the reasons for the corona start problem of the ionizing device. Process formation of a relatively thick (in 10th to 100th or more Angstroms) oxide "skin" on silicon wafers in open air are recorded in the above-cited reference, "Growth of native oxide" Stanford University Nanofabrication Facility. For example, during six days, the $SiO_2$ surface layer can reach thickness of 12 Angstrom. Silicon oxide is known as a good insulator. So, this skin growth results in a higher surface and contact resistance of the silicon based emitters. The rate of oxide layer growth is variable and dependent from many ambient atmospheric factors like oxygen and ozone concentration (see, "Silicon oxidation by ozone" at the web link http://iopscience.iop.org/0953-8984/21/18/183001/pdf/cm_9_18_183001.pdf), temperature, moisture, and so on. Ozone is one of the byproducts of corona discharge and may accelerate oxidation of a silicon emitter. This phenomenon has a profound effect for relatively low power voltage of HF ionizers with silicon based non-metallic emitters. An exemplary embodiment of the invention includes surface treatment of a silicon based emitter to decrease contact resistance between the emitter and metallic socket.

FIG. 1(a) is an illustration of a conventional silicon emitter 100a. The emitter 100a comprises four distinctive parts: tip 101a, taper 102a, shaft 103a, and tail 104a. The shape and size of the tip 101a depends on the available amount of high voltage and current from HVPS (high voltage power supply), material of the emitter as well as technology and methods of production. The emitter tip 101a is usually the most critical part of any ion emitter. The emitter tip 101a is directly exposed to corona discharge and determines the life span of the emitter. Silicon emitters has a generally cylindrical shaft 103a. The shaft 103a mainly defines the length of the emitter and distance between the taper and socket or receptacle connected to the high voltage power supply. The taper or cone 102a is a transitional part between the tip 101a and shaft 103a. Silicon is a brittle material by nature and the taper angle is a compromise of mechanical strength and electrical characteristics of the emitter. Tail 104a may be rounded, beveled, or chamfered. This part should assist in inserting the emitter 100a into a socket or receptacle. Standard high purity silicon emitters have a smooth surface as a result of chemical polishing (which is usually achieved by strong acid treatment).

FIG. 1(b) shows an illustration of a silicon emitter with a metallic sleeve. The silicon emitter 100a comprises a non-metallic silicon part 101b and stainless steel tube 102b (or sleeve 102b) with a dimple 105b. The sleeve 102b should protect the brittle silicon emitter 101a from mechanical (handling) damage. The sleeve 102b also should improve electrical connection of a non-metallic high purity silicon emitter and metallic sockets or receptacles. Views 103b and 104b show the assembled drawings of a silicon emitter 100a with metallic sleeve 102b. View 106b presents a cross section of the assembled emitter shaft 103a.

A big part (or a significant portion) of the silicon shaft 103a is encased into metal sleeve 102b as it is shown in view 103b. To fix the sleeve 102b on the silicon shaft 103a and achieve reliable electrical contact between them it is common to make at least one protrusion 105b (dimple) on the sleeve 102b. Taking into consideration the tolerances in dimensions of all three components (diameter of silicon emitter shaft, inner diameter of the sleeve and depth of the dimple) the assembly operation is quite challenging (see cross sectional view silicon shaft and dimple on view 106b).

FIG. 1(c) shows an illustration of another design of a silicon emitter 100c. The emitter part 101c is shown with a surface oxidation layer ("skin") 102c presented by a dashed line. The emitter 100c comprises a silicon part 101c and sleeve 103c with dimple 104c. Sleeve 103c may have one or more sections/extension parts 106c with grooves 107c. The emitter assembly is shown in view 105c. This design permits to keep the emitter in nozzles and uses extension parts 106c for inserting extension parts 106c into different sockets or receptacles.

Figure 2:
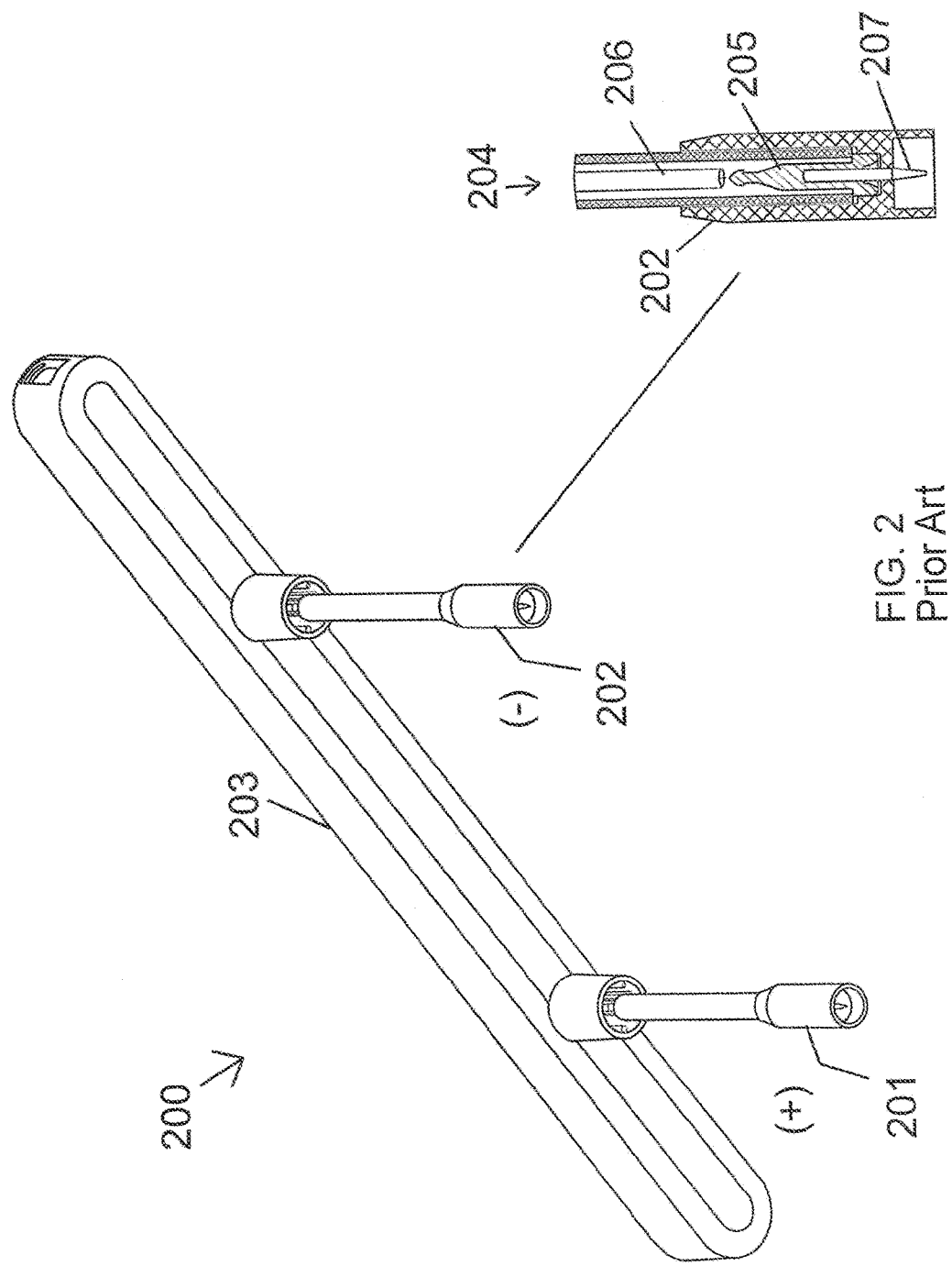
FIG. 2 shows an illustration of a conventional DC room ionization ceiling system with two single crystal silicon emitters.

FIG. 2 shows an illustration of a conventional DC room ionization system 200 similar to that used in U.S. Pat. No. 5,447,763. The ionizer has a couple of rods, positive (+) rod 201 and negative rod (−) 202, carrying single crystal silicon emitters. The rods are connected to dedicated positive and negative high voltage power (HVDC) supplies 203 (placed in a chasse). Cross sectional view of the emitter rod is shown in view 204. The end part of the rod 202 has a socket type connector 205 and a high voltage cable 206 connected to the HV DC power supplies 203. The socket 205 accommodates a silicon type emitter 207 shown in view 204. Other parts of the rod 202 serve as protectors of the emitter 207, connector 205 and HV cable 206 from a destructive force. The rod design makes the silicon emitters 201, 202 to be exchangeable.

At least some goals of exemplary embodiments of the invention are to suggest low particle emission, by economical silicon based charge neutralization systems. A composition of a silicon based emitter which has less than 99.99% and more than 70% silicon by weight in combination with high frequency corona discharge make the goal of low particle emission achievable. For a non-metallic silicon electrode in the ionization system, the next primary goal is to provide a reliable electrical connection between the silicon based emitter and HF high voltage power supply.

Figure 3:
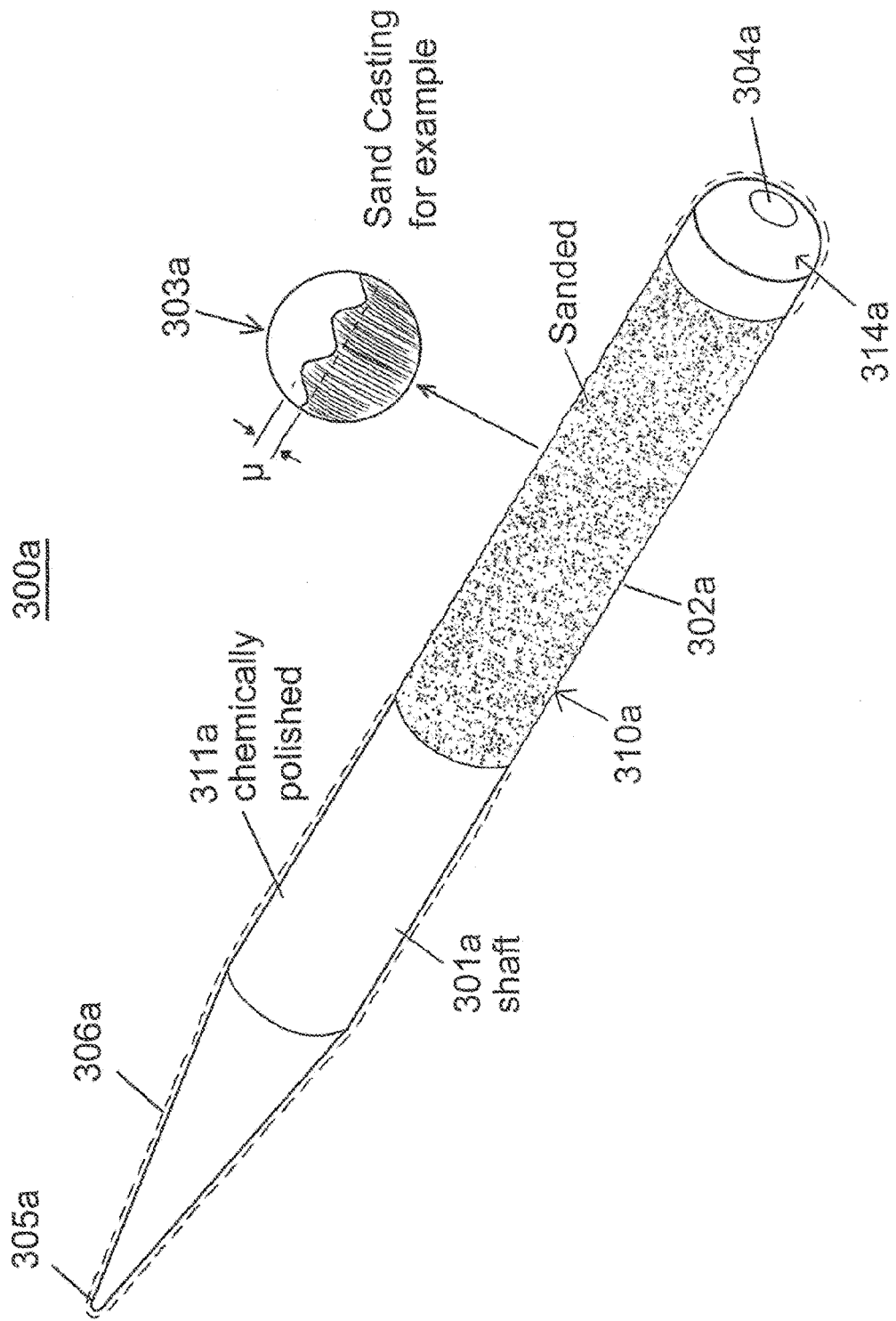
FIG. 3(a) shows an illustration of a silicon-containing emitter, according to an embodiment of the invention, wherein the emitter comprises a section of the emitter shaft having a preselected surface roughness (or a treated surface section).
FIG. 3(b) shows an illustration of an emitter, according to another embodiment of the invention, wherein the emitter comprises a section of the emitter shaft having a partial conductive surface plating or partial conductive surface coating (or treated surface section of other types).
FIG. 3(c) shows an illustration of a silicon-containing emitter and an apparatus to monitor the surface electrical resistance and/or volume electrical resistance of the emitter, in accordance with an embodiment of the invention.
Figure 3:
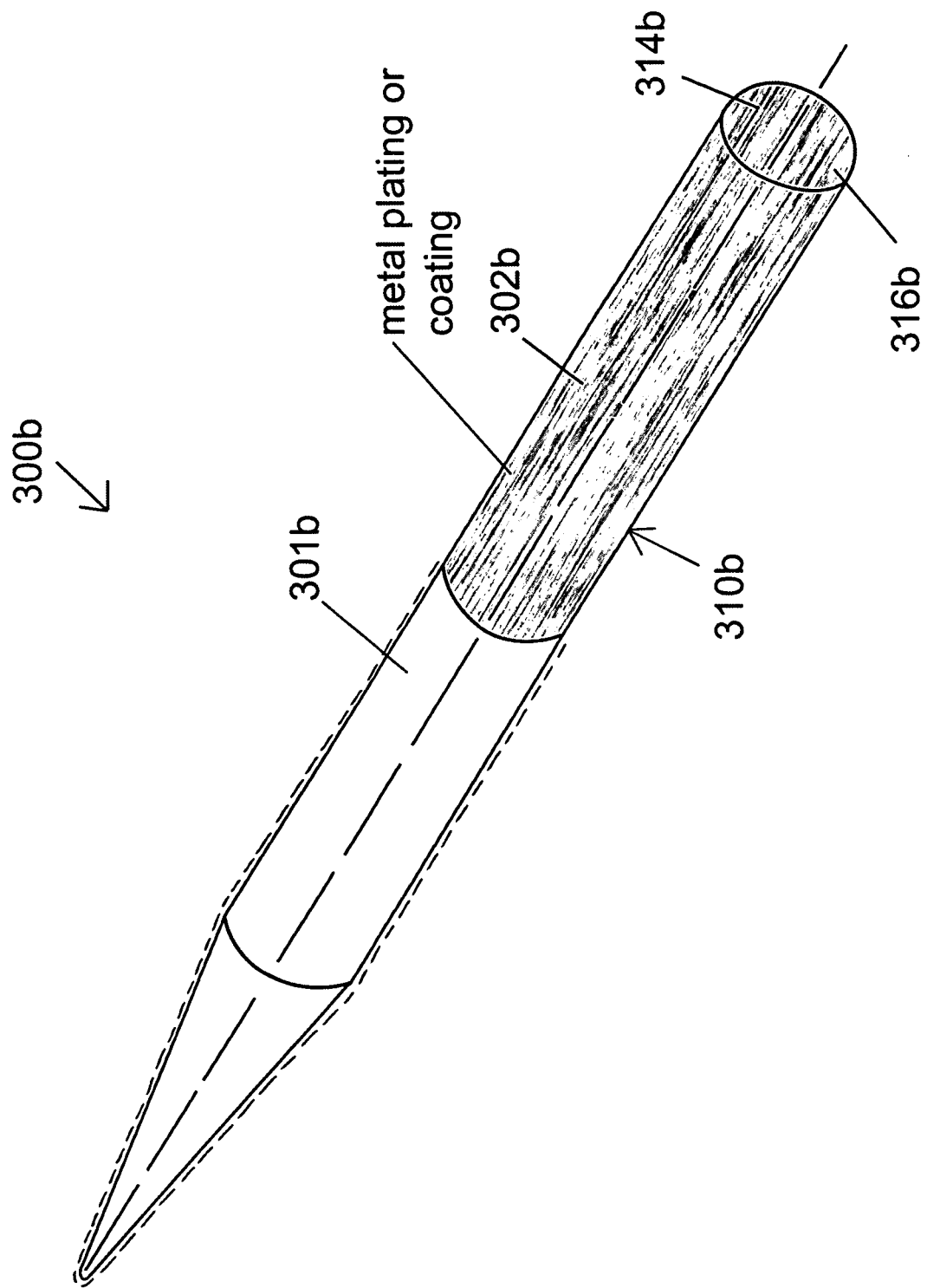
Figure 3:
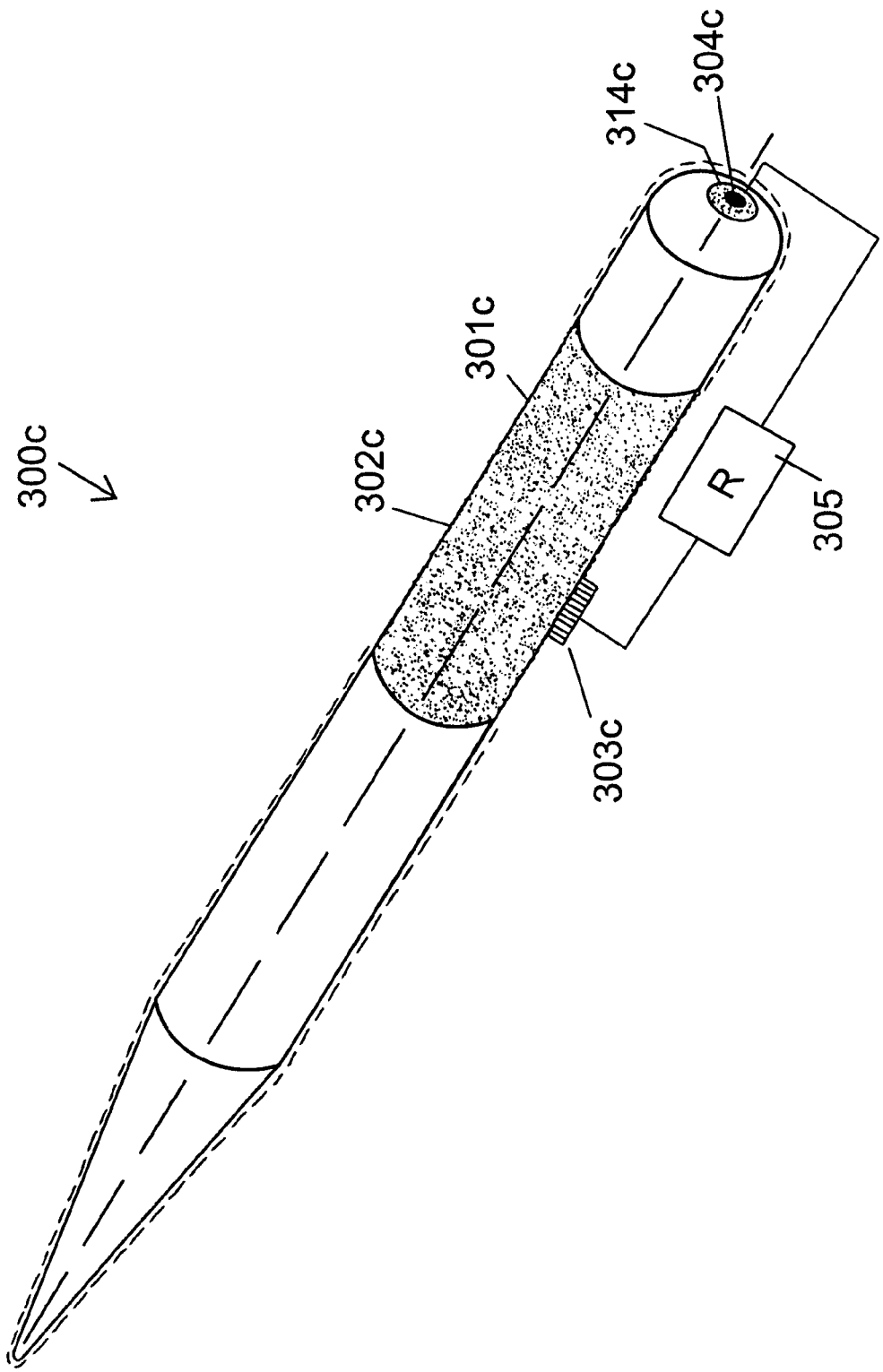

FIG. 3(a) shows an illustration of a silicon based emitter 300a according to an embodiment of the invention, wherein the emitter 300a comprises an abrasive portion or sand casting treated portion 310a (i.e., treated surface section 310a) of shaft 301a which can be inserted in a high voltage socket (not shown). This portion 310a of the shaft surface 302a has roughness H in the range of approximately 0.5 micron to 10 micron (see view 303a). During surface treatment, for example by sanding, the oxide "skin" previously on the shaft surface 302a will be destroyed and deleted or otherwise removed. Sanding creates an emitter shaft surface profile which is able make multi-spot contacts with the high voltage socket (not shown). Optionally, similar surface treatment can be applied to the rounded end 304a of the tail 314a of the emitter 300a. The emitter tip 305a, taper 306a, and part 311a of the shaft 301a has regular chemically polished surfaces.

One more embodiment of a silicon based emitter is illustrated in FIG. 3(b). According to this embodiment of the invention, the silicon based emitter 300b comprises a portion 310b (i.e., treated surface section 310b) of the emitter shaft 301b having a metallic plating or metallic coating 302b (or conductive plating or metallic coating 302b) which makes the portion 310b of the shaft 301b to be a good surface conductor and protect contact portion 316 of emitter 300b from oxidation in the long term. The contact portion 316 can be in the tail 314b of the emitter shaft 301b.

Different known methods of silicon plating (e.g., like vacuum deposition, electrolytic plating, spraying, and others) can be used. Plating materials like metals may include: e.g., nickel, brass, silver, gold, and other metals as well as alloys acceptable in semiconductor industry.

FIG. 3(c) shows an illustration of a silicon-containing emitter and an apparatus to monitor the surface electrical resistance and/or volume electrical resistance of the silicon-containing emitter, in accordance with an embodiment of the invention. This shows an example of an electrical quality control operation of silicon based emitters 300c as shown in FIG. 3(c). The control and/or monitoring include electrical resistance measurements or monitoring the electrical resistance and/or composition of the emitter 300c or a treated surface section 302c of the emitter 300c. Conductive electrodes 303c and 304c are attached to or connected to the sanded parts 302c (or treated surface section 302c) of emitter shaft 301c and tail 314c, respectively, of the emitter 300c. Standard resistance R measuring device 305 can be used to make and record measurements of the electrical resistance R. This way, complex surface and volume resistivity and the emitter composition can be monitored. The required normal quality and composition (with less than 99.99% to at least 70% silicon by weight) silicon based emitters should have complex resistance in kilo ohms range. After surface treatment and control operation the emitter 300c can be inserted into a standard metallic socket (not shown) to minimize formation of new layers of silicon oxide "skin".

At least some of the exemplary embodiments shown herein allow solving of two fold problems: (1) creating reliable electrical connection between non-metallic silicon based emitters and sockets; and (2) protecting the contacting portion of the emitter from oxidation.

Figure 4:
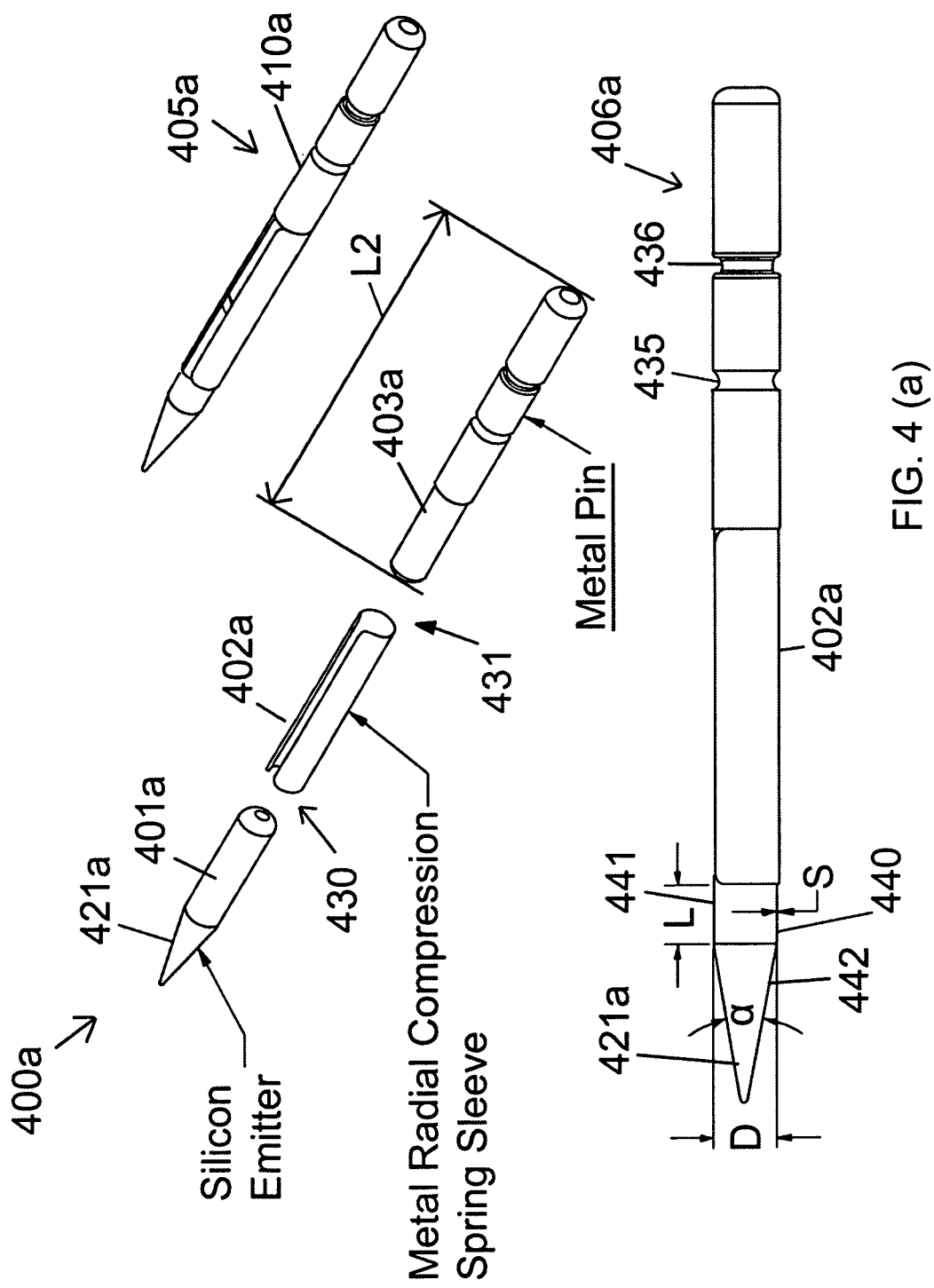
FIGS. 4(a) and 4(b) show illustrations of a silicon-containing emitter with two variants of radial compression spring sleeves and metal pins, in accordance with various embodiments of the invention.
Figure 4:
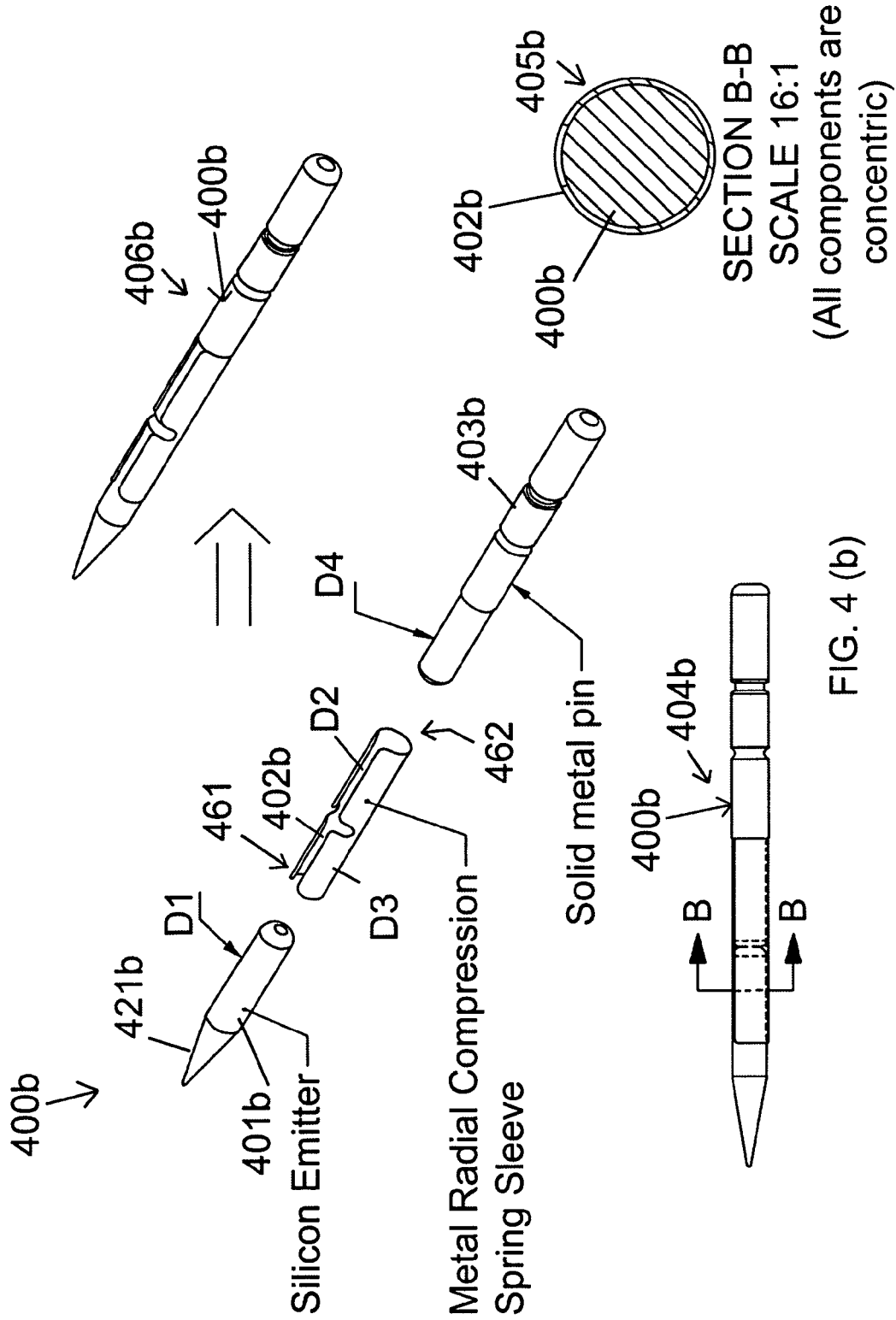

FIGS. 4(a) and 4(b) show illustrations of a silicon-containing emitter with two variants of radial compression spring sleeves and metal pins, in accordance with various embodiments of the invention. The silicon-containing emitter and metal pin are inserted into the sleeve, as discussed below. The silicon based emitter 400a of FIG. 4(a) in an embodiment of the invention will first be described. According to this exemplary embodiment, the emitter 400a comprises the emitter part 401a wherein the silicon portion of the emitter part 401a has a reduced length/shaft diameter ratio. The short silicon based emitter part 401a is connected to a metal radial compression spring sleeve 402a from one side 430 of the sleeve 402a. The other side 431 of the sleeve 402a is connected to a solid metal extension pin 403a. The metal pins 403a and 403b discussed herein can be metal electrodes 403a and 403b that are inserted into spring type sleeves 402a and 402b, respectively. This pin 403a may have at least one (or more) groove and a variable length "L2" required by the socket and an ionization cell (including reference electrode) design. For example, the pin 403a includes grooves 435 and 436, although the pin 403a may only have a single groove in other embodiments. The pin 403a can be, for example, a solid metal pin or tube. Conventional, CNC, or automatic metal cutting machines, or other metal proceeding methods can be used to manufacture a pin 403a. View 405a shows an illustration or drawing of the emitter assembly 410a with the silicon emitter 400a according this exemplary embodiment. Radial compression spring sleeve 402a has significantly bigger contact area with silicon part 401a compared with the conventional sleeve 102b with the dimple 105b as shown in FIGS. 1(a) and 1(b). The result is more reliable electrical connection and less mechanical stress applied to a brittle silicon emitter part 401a. The design of silicon emitter with metal sleeve has some requirements to prevent "secondary" corona discharge from an edge of the sleeve to a nearby reference electrode. Main parameters which should be taken into consideration are illustrated in view 406a: D which is a diameter of the silicon emitter shaft 440; L which is a length of exposed portion 441 of the silicon emitter shaft 440; a which is an angle of the taper of tapered portion 442 of the shaft 440; and S which is the thickness of the sleeve 402a. For a high concentration electrical field on the emitter tip 421a of silicon part 401a (or on the emitter tip 421b of silicon part 401b), the first ratio S/D should be in the range of approximately 0.03 to 0.06. Another requirement related to the distance between the emitter tip 421a and sleeve 402 is the second ratio L/S: the ratio L/S should be in the range (2-5)/tan {tangent} (0.5α). The parameter a is an angle of a taper of a tapered portion of the shaft 440 of the at least one non-metallic emitter part 401a or 401b. These conditions of a new silicon emitter design in one embodiment of the invention will satisfy several criteria/specifications: reliable electrical connection, good mechanical strength, and minimum possibility of "secondary" corona will generate particles emission from metal parts.

FIG. 4(b) shows an illustration of another embodiment of a silicon based emitter 400b comprising another configuration of a metal radial compression spring sleeve 402b. In this case, the emitter 400 comprises a silicon emitter part 401b has a diameter D1 and one end 461 of metal sleeve 402b has a diameter D3. Silicon emitter part 401b has an emitter tip 421b. Part 403b is a solid metal pin 403b which has diameter D4 and another end 462 of the sleeve 402b has a diameter D2. Differences in diameters (D1>D3) of silicon emitter part 401b and metal sleeve 402b create a required compression force to provide a reliable or good electrical contact between the silicon part 401b and metal sleeve 402b. Similarly, differences in diameters (D2<D4) provide a reliable or good electrical connection between metal sleeve 402b and metal pin 403b. Views 404b and 406b show assembled views of the silicon emitter 400b. View 405b is a cross sectional view which shows, according to this exemplary embodiment, the silicon emitter 401b and sleeve sections 402b having big contact areas with minimum contact pressure and local stress. The assembly operation is simplified. Both exemplary embodiments (emitters 400a and 400b) use a minimum amount of expensive silicon based material, have big reliable contact areas of non-metallic emitter shaft with metal sleeves, and good dimensional matching to standard sockets or receptacles.

In some cases silicon based emitters have problem to start high frequency corona discharge and reliably produce ion generation in spite of having normal surface/volume electrical resistance and good electrical connection to high voltage sockets. Our experiments show that the core of this problem is due to the formation of thick isolative oxide "skin" on the surface of the emitter tip ("working horse" of the emitter). One more exemplary embodiment of this invention addresses this problem. The shape of the tip of the silicon-containing emitters may have some positive effect on the rate of formation and thickness of isolative oxide "skin".

Figure 5:
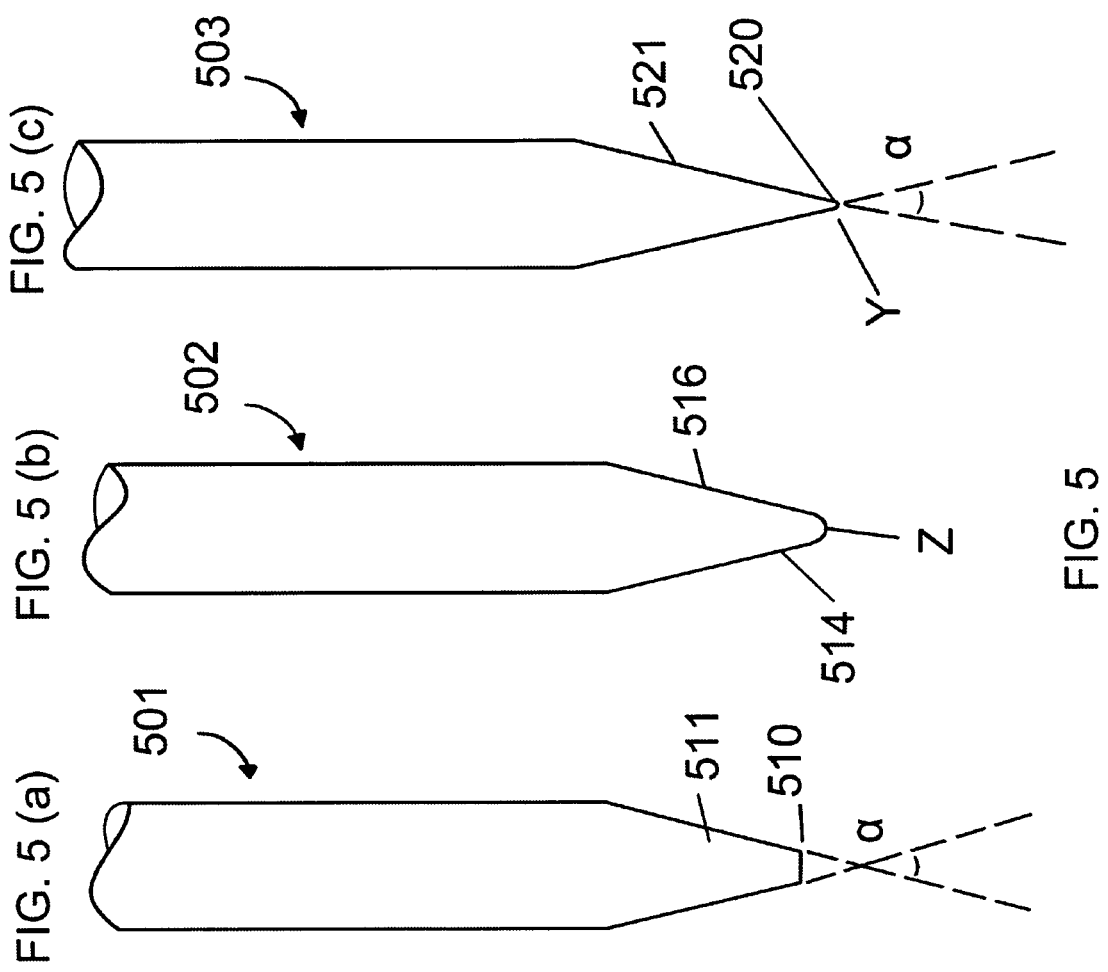
FIGS. 5(a), 5(b), and 5(c) show illustrations of three silicon-containing emitters that have different configurations of the taper and tip, in accordance with various embodiments of the invention.

FIGS. 5(a), 5(b), and 5(c) show illustrations of three silicon-containing emitters that have different configurations of the taper and tip, in accordance with various embodiments of the invention. The various tip configurations and taper configurations shown in FIGS. 5(a), 5(b), and 5(c) determine an operating HF corona onset voltage and ionization current parameters.

In FIG. 5(a), there is shown a silicon based emitter 501 with a flattened truncated tip. This tip design is prone to create a ring type high frequency corona discharge (where flattened tip 510 meets the taper 511 of the emitter 501). This emitter 501 may reduce ion current density and particle emission. However, it is characterized by higher onset HF corona voltage. The taper 511 is at an angle value of α with respect to the flattened tip 510.

Silicon based emitter 502 (FIG. 5(b)) has small rounded tip 514 with a radius Z in the range of approximately 60 microns to 400 microns which is less expensive in production and minimizes corona current fluctuation. The taper portion 516 (of emitter 502) extends from the small rounded tip 514.

A sharpened silicon based emitter 503 (FIG. 5(c)) has a sharp pointed tip 520 with a radius Y in the range of approximately 40 microns to 50 microns, or less. This emitter 503 has the lowest corona onset voltage $V_{on}$. However, the ion current density for the emitter 503 is at maximum and spattering, erosion, and oxide "skin" growths are at the highest rate. This silicon based emitter 503 preferably used for ionization in oxygen free gases like nitrogen or argon. The taper/conical portion 521 of the emitter 503 preferably has angle α in the range of approximately 10 degrees-20 degrees with respect to the sharp pointed tip 520. All silicon based emitters (501, 502, 503) have a composition according to exemplary embodiments of this invention and are able to provide low particle counts when installed in in-line ionizers, ionizing bars, and other charge neutralizers driven by the HF AC voltages. The degree of sharpness and the curvature of the tip (i.e., configuration of the tip) affect or determine ionizer operating parameters including onset voltage, ion current, and ion balance, but they do not affect the scope of the instant invention.

One more exemplary embodiment of this invention addresses oxide "skin" growth on the silicon emitter tip. The embodiment uses specific mode of corona discharge to clean the silicon emitter tip from the oxide skin and help ionizer start up independently from the emitter profile.

Figure 6:
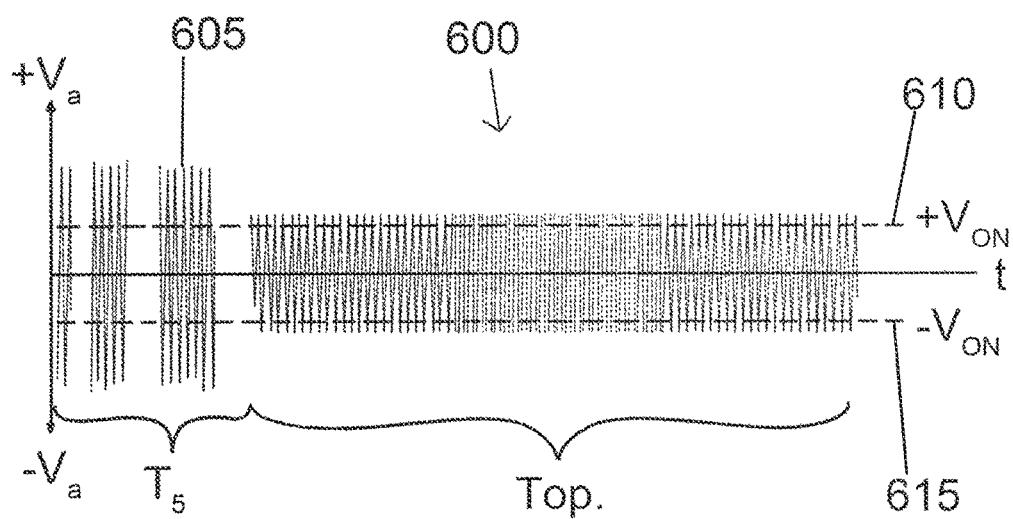
FIG. 6 shows an illustration of an HF waveform to perform "soft" plasma cleaning of a silicon-containing emitter tip during "start up" of corona ionization period, in accordance with an embodiment of the invention.

FIG. 6 shows an illustration of an HF waveform to perform "soft" plasma cleaning of a silicon-containing emitter tip during a "start up" of a corona ionization period, in accordance with an embodiment of the invention.

The high voltage "HF startup" type waveform 600 is applied to the emitter. This mode of high voltage drive provides a group (numbered from 1 to up to several hundred bipolar pulses 605) of short duration bipolar voltage bursts to the emitter during the start-up period (marked as a Ts period).

Thanks to the very short duration of power profile in the range milliseconds, microseconds or less, the HF corona associated plasma has very limited energy. This way prevents both a rising temperature of the emitter tip and a surface destruction (spattering, erosion, and particle emission) of the emitter tip. Short duration HF plasma bursts performs only "soft" cleaning of the emitter tip from silicon oxide skin. The duration of the "startup" time period Ts, burst pulse amplitude, and the number of pulses may vary and depend from thickness of the silicon oxide skin, gas media, emitter tip design, and so on. The voltage amplitude of HF burst pulses is significantly higher (approximately 25% to 100% or more) than normal (operational) corona onset voltages positive (+)Von and negative (−)Von (shown in FIG. 6 by two dash horizontal lines 610 and 615, respectively). The initial "startup" mode helped to start normal/operational high frequency corona discharge and ion production. During normal/operational mode (during time Top), the high voltage amplitude can be only 10%-20% higher than corona onset voltages (+)Von or (−)Von to minimize particle emission. In continuous operation mode the HF corona discharge is able to protect silicon emitter from oxidation in clean dry gas media. Therefore, soft plasma cleaning of the at least one non-metallic emitter is performed during a start up period of a corona ionization period by a voltage/power waveform different from a voltage/power waveform during an operational period.

Figure 7:
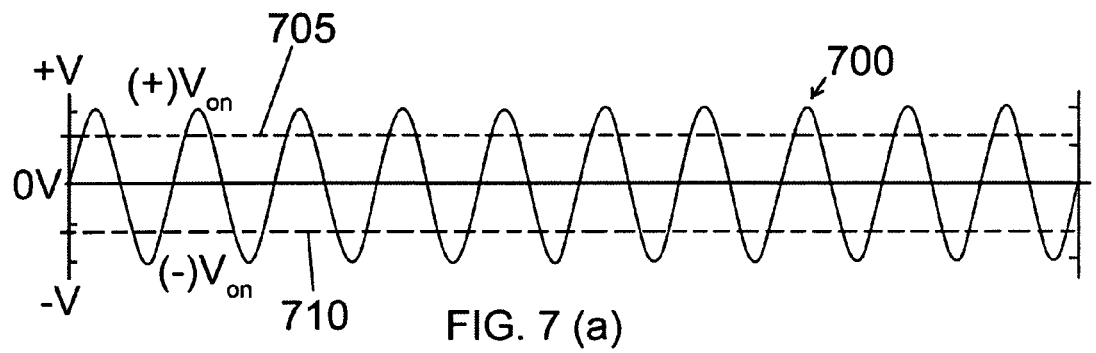
FIGS. 7(a), 7(b), and 7(c) show illustrations of examples of high frequency power voltage wave forms applied to a silicon based emitter during an operational mode, in accordance with various embodiments of the invention.
Figure 7:
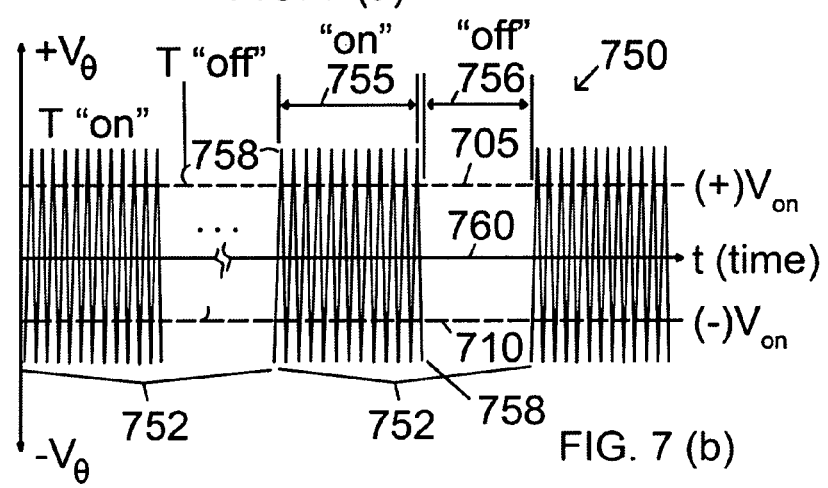
Figure 7:
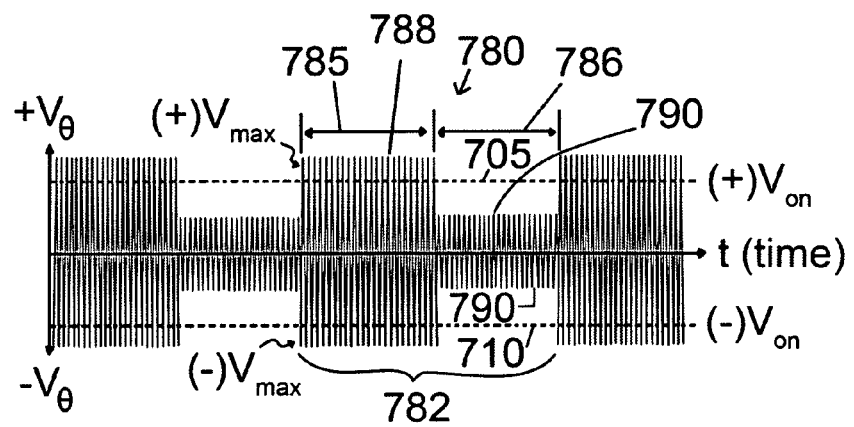

FIGS. 7(a), 7(b), and 7(c) show illustrations of examples of high frequency power voltage wave forms applied to a silicon based emitter during an operational mode, in accordance with an embodiment of the invention. The different operational HF voltage waveforms effectively create bipolar ionization for silicon based emitters. The function of the high frequency AC voltage is to create both polarity ions (positive ions and negative ions) at a minimum driving voltage. To create ions, the peak voltages (positive and negative peak voltages) exceed the corona onset voltages. As shown in FIG. 7(a), the high frequency AC voltage profile 700 is continuous, but the profile may also be modulated continuous or non-continuous and periodic.

FIG. 7(a) presents a continuous sign wave type powering voltage 700 which may have a frequency range from approximately 1 kHz up to approximately 100 kHz. Positive and negative voltage amplitudes of the voltage 700 are higher than positive corona onset voltage (+)Von 705 and lower than the negative corona onset voltage (−)Von 710. This voltage type waveform 700 provides maximum power to the silicon based emitter described herein and create maximum ion current.

FIG. 7(b) shows an illustration of a voltage waveform 750 comprising groups of pulse trains 752 with "on" periods 755 and "off" periods 756. The waveform 750 comprises at least one modulation portion, wherein each modulation portion comprises a pulse train 752 having an on period 755 and an off period 756. During an on period 755 in a pulse train 752, the waveform 750 has an amplitude 758 that exceeds the positive corona onset voltage threshold 705 and that exceeds the negative corona onset voltage threshold 710 for a particular emitter. During an off period 756 in a pulse train 752, the waveform 750 has an amplitude 760 that does not exceed the corona onset voltage thresholds 705 and 710. In the example of FIG. 7(b), this amplitude 760 is a voltage magnitude of approximately zero. Additional details of the waveforms 700, 750, and 780 in FIGS. 7(a), 7(b), and 7(c), respectively, are also described in commonly-owned and commonly-assigned U.S. Pat. No. 8,009,405 to Peter Gefter et al. During "off" periods 756 (which can be small duty factor), corona discharge (ion production) and particle emission stops. The duty factor can be variable in the range from approximately 100% down to approximately 0.1% or less depending upon a required ion output. A minimal duty factor helps to suppress particle emission and emitter erosion rate.

FIG. 7(c) shows an illustration of another variant of voltage waveform 780 where a duty factor is close to approximately 100%, but the voltage amplitude applied to the silicon emitter periodically drops to values lower than the corona onset voltage (in the range of approximately 90% to approximately 50% or less from corona onset voltage). An advantage of this waveform is that it may minimize both particle emission and high voltage swing (voltage/electrical field variation).

The waveform 780 comprises at least one modulation portion, wherein each modulation portion comprises a pulse train 782 having an on period 785 and a non-operation period 786. During an on period 785 in a pulse train 782, the waveform 780 has an amplitude 788 that exceeds the positive corona onset voltage threshold ((+)Vmax) 705 and that exceeds the negative corona onset voltage threshold ((−)Vmax) 710 for a particular emitter. During a non-operation period 786 in a pulse train 782, the waveform 780 has an amplitude 790 that does not exceed the corona onset voltage thresholds 705 and 710, but the amplitude 790 is more than zero volts.

Figure 8:
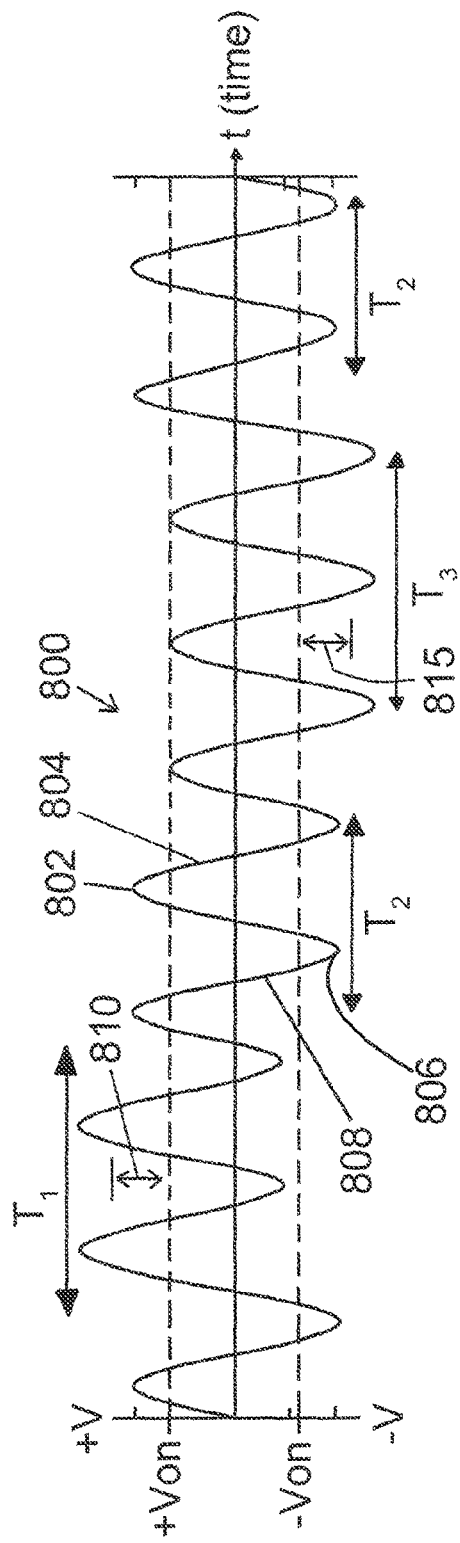
FIGS. 8(a) and 8(b) show illustrations of examples of modulated high frequency voltage wave forms, in accordance with various embodiments of the invention.
Figure 8:
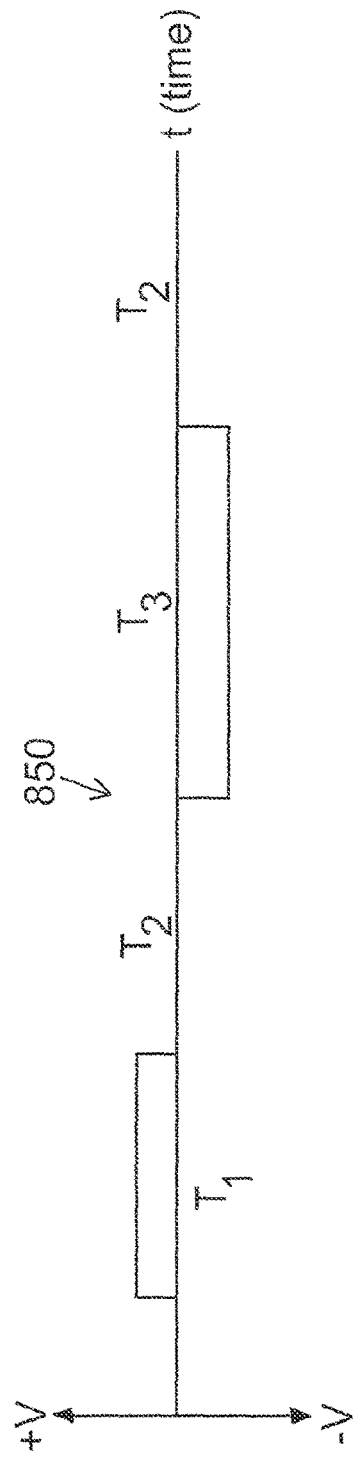

FIGS. 8(a) and 8(b) show illustrations of examples of modulated high frequency voltage wave forms, in accordance with an embodiment of the invention. FIG. 8(a) presents a continuous modulated waveform 800 as a result of mixing (combination) of high frequency and low frequency voltages. The low frequency component (or offset voltage) is shown in FIG. 8(b). This voltage waveform 850 predominately creates ions by a high frequency component (similar to the waveform 700 shown in FIG. 7(a)) and moves ions from the emitter by the low frequency component.

Figure 9A:
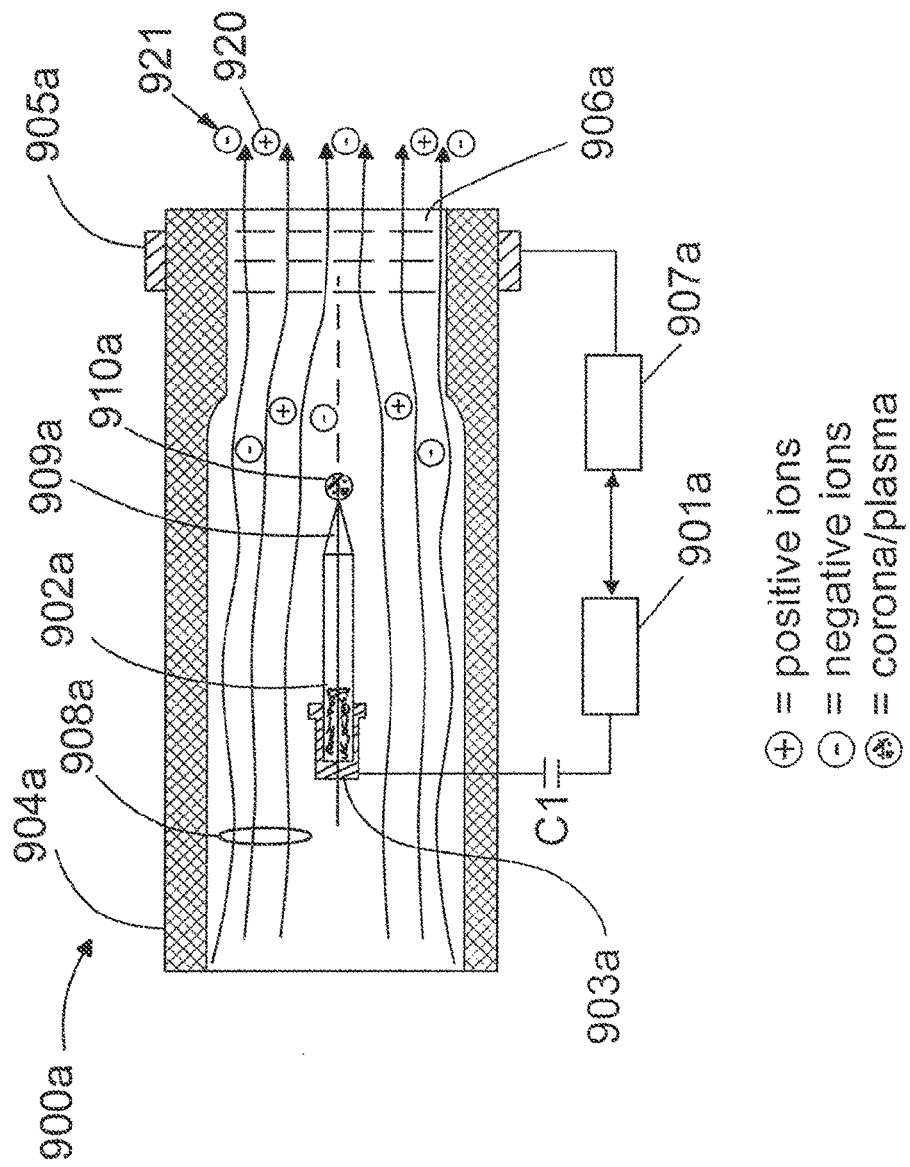
FIG. 9(a) shows an illustration of an ionizing cell/chamber of an in-line ionizer, in accordance with an embodiment of the invention. A high frequency AC powered silicon based emitter generates both polarity ions. An air/gas flow is moving the stream of ions from the emitter.
Figure 9:
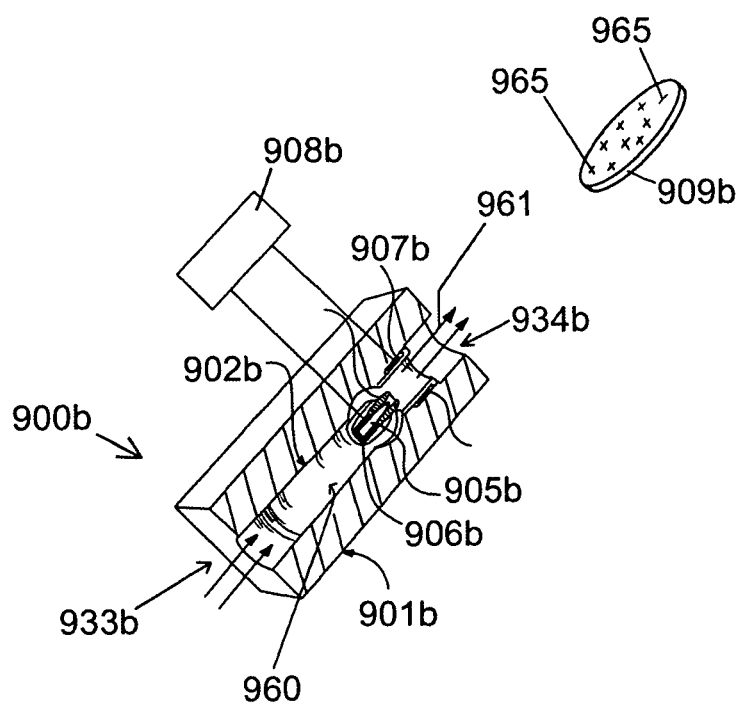
FIG. 9(b) shows an illustration of the gas channel and the ionization cell, in accordance with an embodiment of the invention.
FIG. 9(c) shows a simplified block diagram of an in-line ionizer with a silicon based emitter, in accordance with an embodiment of the invention.
Figure 9:
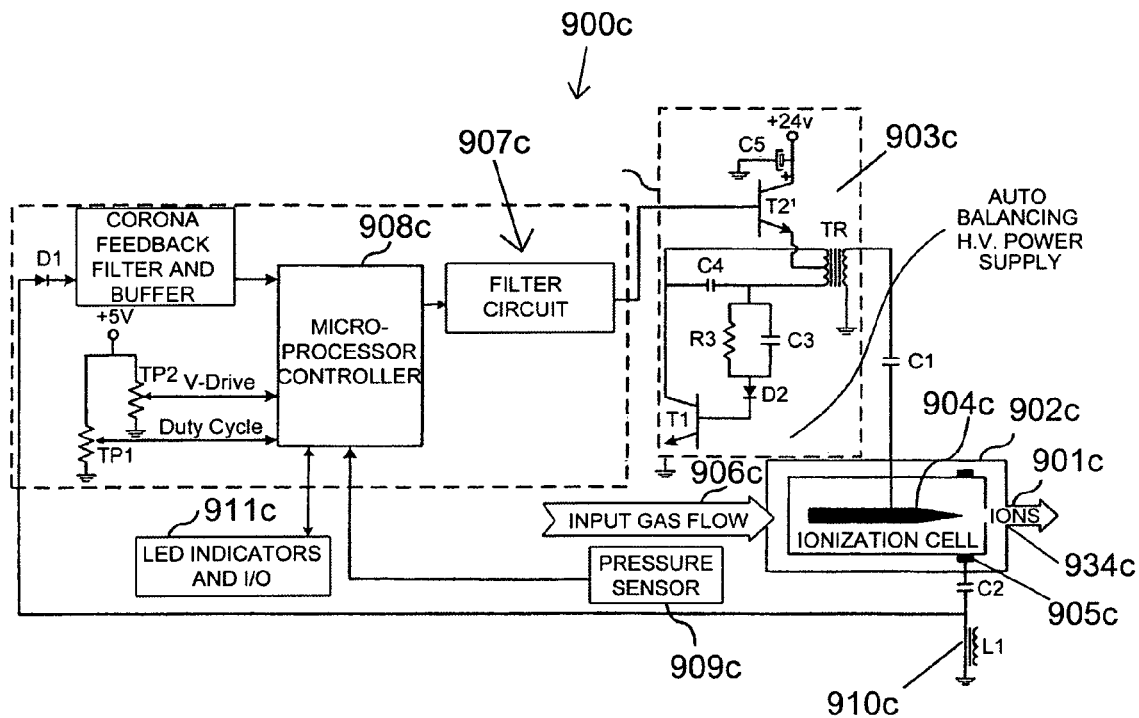

In-line ionizers with silicon based emitters can be used in the most critical operations/processes (e.g., environments like Airborne Particulate Cleanness Class 1) in the semiconductor industry. FIGS. 9(a), 9(b), and 9(c) present illustrations of simplified views of ionization cells and block diagrams of the in-line ionizer. With an in-line ionizer design, the application of the HF frequency voltage may be similar to the waveform shown in FIG. 8(a) with extended in range from approximately 20 kHz to upward of approximately 100 kHz.

FIG. 9(a) shows an illustration of an ionizing cell/chamber of an in-line ionizer, in accordance with an embodiment of the invention. A high frequency AC powered silicon based emitter 902a generates both polarity ions. An air/gas flow 908a is moving the stream of ions from the emitter 902a. Also shown in FIG. 9(a) an ionization cell 900a is connected to HF HV generator 901a. Silicon based emitter 902a is positioned in a socket 903a and is connected via capacitor (C1) which is connected to the HF generator 901a. The emitter 902a may have sanded or metal plated portion of the shaft as previously discussed in FIG. 3(a) and FIG. 3(b), respectively, to provide reliable connection to socket 903a.

The emitter 901a is typically positioned in the middle part of air/gas channel 904a. Preferably, the reference electrode 905a positioned on an outer side of the channel 904a and close to the outlet 906a of channel 904a. The reference electrode 905a is connected to control system 907a. Positive ions 920 and negative ions 921 are generated by the emitter 901a when the peak voltages (positive or negative voltages) of the high frequency AC voltage (applied to emitter 901a) exceed the corona onset voltage. Air/gas flow 908a from an external source (not shown) still need to move a generated ion cloud toward distant target charge neutralization (not shown). Corona discharge near the tip 909a of the emitter 902a creates intense HF plasma 910a with ions and electrons near the tip 909a of silicon emitter 902a. The corona onset voltage is approximately (+) 5 to 6 kV for positive ions and (−) 4.5 to 5.5 kV for negative ions.

Generation/emission corona byproducts like particles in plasma are minimized by methods, apparatuses, and means previously discussed as the combination of ion emitter composition, ion emitter design, and powered voltage waveforms.

FIG. 9(b) shows an illustration of another view 900b of the ionization cell and gas channel in a block 901b, in accordance with an embodiment of the invention. The channel 902b has an inlet 933b and an outlet 934b. The silicon based emitter 905b with socket 906b can be made as an exchangeable unit positioned in a cavity 960 of the channel 902b. The emitter socket 906b and reference electrode 907b are connected to high voltage HF power supply 908b. Ionized gas flow (shown by arrows 961) are moving ion clouds to the charged target 909b like wafer and the ion clouds will neutralize these charges 965 on the charged target 909b.

FIG. 9(c) shows a simplified block diagram of an in-line ionizer 900c with a silicon based emitter 904c, in accordance with an embodiment of the invention. Positive and negative ions 901c are created inside the ionization cell 902c. A high voltage HV-HF power supply 903c provides the voltage and current needed to generate the ions 901c. The power supply 903c delivers a high frequency AC voltage to the silicon based emitter 904c through capacitor C1. Voltage on the silicon based emitter 904c is relative to a reference electrode 905c.

A pressurized source of air, nitrogen, or argon is connected to the in-line ionizer 900c via an inlet to create an air flow or gas flow 906c. The air flow or gas flow 906c entrains positive and negative ions 901c and carries the ions 901c through the ionizer outlet 934c toward a target (e.g., target 909b in FIG. 9(b)).

The in-line ionizer 900c includes a control system 907c comprising a microprocessor 908c, gas pressure sensor 909c, corona discharge sensor 910c, and operation status indicators 911c. The in-line ionizers 900c are often working in semiconductor tools having wafers load/unload operations. That is why the in-line ionizers 900c may have a relatively long idle ("stand off") periods without corona discharge and gas flow. During those time periods the tip of silicon emitter may grow silicon oxide layer. As previously discussed in an exemplary embodiment illustrated in FIG. 3(a) and FIG. 6, the control system 907c initiates gas ionization process by starting the high voltage power supply 903c in the "startup" mode. The corona discharge sensor 905c and processor 908c are continuously monitoring the status of corona discharge up to the point when a strong and stable corona and ion production are achieved. After that, the control system 907c and power supply 903c are switched to the normal operation mode.

FIGS. 10(a), 10(b), 10(c), and 10(d) show illustrations of a simplified structure of a high frequency AC ionizing bar 1000a, and details of nozzles with silicon based ion emitters, in accordance with an embodiment of the invention. FIGS. 10(a) and 10(b) shows views of a high frequency AC ionizing bar 1000a with a plurality of raw silicon based emitters 1001a through 1008a (as an example). Each silicon emitter has a stainless steel sleeve. The stainless steel sleeve is shown as sleeve 1020c in FIG. 10(c), and as sleeve 1020d in FIG. 10(d). Each stainless steel sleeve 1020a is installed in a nozzle. Each nozzle has socket and optionally one or two air/gas jet orifices. Cross sectional view of the nozzles are shown as nozzles 1030c in FIGS. 10(c) and 1030d in FIG. 10(d).

The socket 1009c is connected to a common high voltage bus and the orifices to manifold (not shown) both located inside enclosure 1010a of the ionizer bar 1000a. The cross-sectional view 1040 of the nozzle 1030d shows the relative position of the silicon emitter 1003d (with sleeve and groove as previously discussed in FIGS. 4(a) and 4(b)) and orifices 1004d. The bus distributes HF power from the high voltage AC power supply to each nozzle and emitter. The HF-HV power supply with microprocessor based control system is preferably position inside the same enclosure 1010a. The silicon based ion emitters receive HF AC voltages in the range of approximately 6 kV to 8 kV with basic frequency at approximately 10 kHz to 26 kHz (similar to shown in FIG. 7(a)). This HF high voltage creates corona discharge between each emitter 1001a through 1008a and reference electrode 1011a. This high frequency AC voltage is sufficient in itself to create a clean bipolar ionization when the composition of the emitter is in the range from less 99% to with greater than 70% silicon are employed. As previously discussed the high frequency itself is not able to move ion cloud far away. HF ionizing bars 1000a often installed in flat panel or semiconductor tools at relatively short distance (e.g., approximately 50 mm to 300 mm) from targets. The electrical field of charged target (not shown) attracts ions opposite polarity in this case. However, for efficient charge neutralization at longer distances (e.g., approximately 400 mm to 1500 mm) ions cloud requires assistance from an air/gas flow or an electrical field, or combination of both. Often HF ionizing bars can be used in combination with HEPA filters providing clean laminar air flow.

FIG. 8a shows modulated HF waveform 800 which creates an additional low frequency field (with a frequency of approximately 0.1 Hz to 200 Hz) to help ion delivery to the target. During periods T2 the amplitude 802 of positive voltage wave 804 and amplitude 806 negative voltage wave 808 are almost equal, and so the offset voltage is close to zero and ion clouds oscillate near silicon emitters. In contrast, during periods like T1 the voltage waveform 800 has a positive offset 810 and positive polarity ion clouds (which are repelled) are moving to the target (see FIG. 8(b)). Similarly, during time periods like T3 voltage waveform 800 has a negative offset 815 and negative polarity ion clouds (which are repelled) are moving to the target. The amplitude and frequency of offset voltages depends from distance between ionizing bar 1000a and target.

High frequency ionizing bars 1000a with silicon based emitters are able to create low emission, to create clean air/gas ionization, and to neutralize charges of fast moving large objects (like flat panels) at distances of, for example, approximately 400 mm up to 1500 mm.

Another embodiment of the invention provides a method for low emission charge neutralization, wherein the at least one above-described non-metallic emitter comprises a reduced silicon section length/shaft diameter ratio.

Another embodiment of the invention provides a method for low emission charge neutralization, wherein the above-described sleeve comprises a metal radial compression spring sleeve and wherein differences in diameters of the at least one emitter, metal pin, and sleeve create a compression force that provide a reliable electrical connection between the at least one emitter, sleeve, and metal electrode.

Another embodiment of the invention provides an apparatus for low emission charge neutralization, wherein the at least one above-described non-metallic emitter comprises a reduced length/shaft diameter ratio.

Another embodiment of the invention provides an apparatus for low emission charge neutralization, wherein the above-described sleeve comprises a metal radial compression spring sleeve and wherein differences in diameters of the at least one emitter, metal pin, and sleeve create a compression force that provide a reliable electrical connection between the at least one emitter, sleeve, and metal electrode.

Another embodiment of the invention provides an apparatus for and method of creating reliable, low-particle emission charge neutralizers by combining: non-metallic ion emitters having chemical composition in the range between less than 99.99% to at least 70% silicon by weight, emitter geometry, and surface treatment (preparation), and a connection arrangement between the emitter and a high voltage power supply operating in high frequency range. In this combination the emitter reliably generates the high frequency corona discharge featured by low onset voltage and low particle emission. This combination is effective for many different type clean room ionizers/charge neutralizers targeted for clean rooms of class 1. The combination of silicon-containing emitters and a high frequency AC voltage produces ionizers that are cleaner than conventional ionizers, based on particles counts greater than 10 nanometers. This improvement in cleanliness has been experimentally determined by the inventors.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for low emission charge neutralization, comprising:
   generating a high frequency alternating current (AC) voltage;
   transmitting the high frequency AC voltage to at least one non-metallic emitter;
   wherein the at least one non-metallic emitter comprises at least 70% silicon by weight and less than 99.99% silicon by weight;
   wherein the at least one emitter comprises at least one treated surface section with a destroyed oxidation layer;
   generating ions from the at least one non-metallic emitter in response to the high frequency AC voltage;
   wherein the at least one non-metallic emitter comprises a first ratio S/D in a range from 0.03 to 0.06;
   wherein S is a thickness of a sleeve that receives the at least one non-metallic emitter; and
   wherein D is a diameter of a shaft of the at least one non-metallic emitter.

2. The method of claim 1, wherein the at least one treated surface section of the at least one non-metallic emitter comprises an area with a pre-selected roughness due to abrasive or sanding processing.

3. The method of claim 1, wherein the treated surface section comprises a metallic plating or metallic coating.

4. The method of claim 1, further comprising:
   providing a measuring device for monitoring an electrical resistance and composition of the at least one emitter.

5. The method of claim 1, wherein the emitter comprises an emitter shaft comprising a silicon based section, wherein the sleeve is a spring type sleeve, and wherein the emitter and a metal electrode are inserted into the spring type sleeve.

6. The method of claim 1, wherein the at least one non-metallic emitter comprises a tip configuration and a taper configuration, wherein both configurations determine an operating HF corona onset voltage and ionization current parameters.

7. The method of claim 1, further comprising:
   performing a plasma cleaning of the at least one non-metallic emitter during a start up period of a corona ionization period by a voltage/power waveform different from a voltage/power waveform during an operational period.

8. The method of claim 1 wherein generating the ions comprises generating positive ions and negative ions at minimum onset HF voltage and power during an operational period.

9. The method of claim 1,
   wherein the at least one non-metallic emitter comprises a second ratio L/S in the range (2-5)/[tan {tangent} (0.5α)];
   wherein L is a length of an exposed portion of a shaft of the at least one non-metallic emitter; and
   wherein α is an angle of a taper of a tapered portion of the shaft of the at least one non-metallic emitter.

10. An apparatus for low emission charge neutralization, comprising:
    at least one non-metallic emitter comprising at least 70% silicon by weight and less than 99.99% silicon by weight;
    wherein the at least one non-metallic emitter comprises at least one treated surface section with a destroyed silicon oxide layer;
    wherein the at least one non-metallic emitter generates ions in response to the high frequency AC voltage;
    wherein the at least one non-metallic emitter comprises a first ratio S/D in a range from 0.03 to 0.06;
    wherein S is a thickness of a sleeve that receives the at least one non-metallic emitter; and
    wherein D is a diameter of a shaft of the at least one non-metallic emitter.

11. The apparatus of claim 10, wherein the at least one treated surface section comprises an abrasive processed portion or sanding processed portion.

12. The apparatus of claim 10, wherein the at least one treated surface section comprises metallic plating or metallic coating.

13. The apparatus of claim 10, wherein an electrical resistance and composition of the at least one treated surface section for the at least one non-metallic emitter is monitored.

14. The apparatus of claim 10, wherein the at least one non-metallic emitter and a metal electrode are inserted into the sleeve, wherein the sleeve is a spring type sleeve.

15. The apparatus of claim 10, wherein the at least one emitter comprises a tip configuration and a taper configuration, wherein both configurations determine operating HF corona onset voltage and ionization current parameters.

16. The apparatus of claim 10, wherein a soft plasma cleaning of the at least one non-metallic emitter is performed during a start up period of a corona ionization period by a voltage/power waveform different from a voltage/power waveform during an operational period.

17. The apparatus of claim 10 wherein the ions comprises positive ions and negative ions generated at minimum HF onset voltage and power.

18. The apparatus of claim 10,
wherein the at least one non-metallic emitter comprises a second ratio L/S in the range (2-5)/[tan {tangent} (0.5α)];
wherein L is a length of an exposed portion of a shaft of the at least one non-metallic emitter;
wherein α is an angle of a taper of a tapered portion of the shaft of the at least one non-metallic emitter.

19. The method of claim 1, wherein the high frequency AC voltage has a frequency of at least 1 KHz.

20. The method of claim 1,
wherein the at least one non-metallic emitter comprises an emitter tip, an emitter shaft, and an emitter tail, and wherein the emitter shaft is between the emitter tip and the emitter tail;
wherein the emitter shaft comprises the at least one treated surface section; and
wherein the at least one treated surface section is configured for insertion into a voltage socket and is configured to provide an electrical connection to a high voltage power supply.

21. The apparatus of claim 10, wherein the high frequency AC voltage has a frequency of at least 1 KHz.

22. The apparatus of claim 10,
wherein the at least one non-metallic emitter comprises an emitter tip, an emitter shaft, and an emitter tail, and wherein the emitter shaft is between the emitter tip and the emitter tail;
wherein the emitter shaft comprises the at least one treated surface section; and
wherein the at least one treated surface section is configured for insertion into a voltage socket and is configured to provide an electrical connection to a high voltage high frequency voltage supply.

* * * * *